US00RE38421E

(19) United States
(12) Reissued Patent
Takahashi

(10) Patent Number: US RE38,421 E
(45) Date of Reissued Patent: Feb. 10, 2004

(54) EXPOSURE APPARATUS HAVING CATADIOPTRIC PROJECTION OPTICAL SYSTEM

(75) Inventor: Tomowaki Takahashi, Yokohama (JP)

(73) Assignee: Nikon Corporation, Tokyo (JP)

(21) Appl. No.: 09/764,157

(22) Filed: Jan. 19, 2001

Related U.S. Patent Documents

Reissue of:
(64) Patent No.: 5,999,333
Issued: Dec. 7, 1999
Appl. No.: 08/987,852
Filed: Dec. 9, 1997

(63) Continuation of application No. 08/429,970, filed on Apr. 27, 1995, now Pat. No. 5,808,805.

(30) Foreign Application Priority Data

Apr. 28, 1994 (JP) ..... 6-90837

(51) Int. Cl.[7] ..... G02B 17/00
(52) U.S. Cl. ..... 359/726; 359/727
(58) Field of Search ..... 359/364, 629, 359/631, 636, 649–651, 726–727, 730, 732–735; 355/67

(56) References Cited

U.S. PATENT DOCUMENTS

| | | | | |
|---|---|---|---|---|
| 3,504,961 | A | 4/1970 | Hoogland et al. | 104/110 |
| 3,737,215 | A | 6/1973 | De Jager | 359/760 |
| 3,897,138 | A | 7/1975 | Kano | 359/674 |
| 3,909,115 | A | 9/1975 | Kano | 359/754 |

(List continued on next page.)

FOREIGN PATENT DOCUMENTS

| | | | |
|---|---|---|---|
| DE | 19726058 | A | 1/1998 |
| EP | 0712019 | | 5/1996 |
| EP | 0717299 | | 6/1996 |
| EP | 0736789 | A | 10/1996 |
| EP | 0770895 | | 5/1997 |
| EP | 0243950 | | 11/1997 |
| JP | 58-04112 | | 1/1983 |
| JP | 58-078115 | | 5/1983 |
| JP | 61-156737 | | 7/1986 |
| JP | 63-118115 | | 5/1988 |
| JP | 2-66510 | | 3/1990 |
| JP | 3-282527 | | 12/1991 |
| JP | 4-42208 | | 2/1992 |
| JP | 4-157412 | | 5/1992 |
| JP | 4-234722 | | 8/1992 |
| JP | 5-72478 | | 3/1993 |
| JP | 05-173065 | | 7/1993 |
| JP | 5-173065 | | 7/1993 |
| JP | 6-313845 | | 11/1994 |
| JP | 07140384 | | 6/1995 |
| JP | 07140385 | | 6/1995 |
| WO | 93/04391 | | 3/1993 |

OTHER PUBLICATIONS

U.S. patent application Ser. No. 09/659,376, filed Sep. 8, 2000, Toshihiro Sasaya et al., Nikon Corporation, Japan.
U.S. patent application Ser. No. 09/665,184, filed Sep. 5, 2000, Tomowaki Takahashi, Nikon Corporation, Japan.

(List continued on next page.)

*Primary Examiner*—Jordan M. Schwartz

(57) ABSTRACT

To use a beam splitting optical system smaller than the conventional beam splitters and to set a longer optical path between a concave, reflective mirror and an image plane. A light beam from an object surface travels through a first converging group to enter a beam splitter, and a light beam reflected by the beam splitter is reflected by a concave, reflective mirror to form an image of patterns on the object surface inside the concave, reflective mirror. A light beam from the image of the patterns passes through the beam splitter and thereafter forms an image of the patterns through a third converging group on an image plane.

96 Claims, 13 Drawing Sheets

U.S. PATENT DOCUMENTS

| | | | | |
|---|---|---|---|---|
| 3,955,883 | A | 5/1976 | Sugiyama | 359/752 |
| 4,080,048 | A | 3/1978 | Kimura | 359/750 |
| 4,386,828 | A | 6/1983 | Hirose | 359/687 |
| 4,497,015 | A | 1/1985 | Konno et al. | 362/268 |
| 4,592,625 | A | 6/1986 | Uehara et al. | 359/663 |
| 4,666,273 | A | 5/1987 | Shimizu et al. | 353/101 |
| 4,685,777 | A | 8/1987 | Hirose | 359/366 |
| 4,701,035 | A | 10/1987 | Hirose | 359/366 |
| 4,770,477 | A | 9/1988 | Shafer | 359/355 |
| 4,779,966 | A | 10/1988 | Friedman | 359/730 |
| 4,812,028 | A | 3/1989 | Matsumoto | 359/366 |
| 4,851,978 | A | 7/1989 | Ichihara | 362/268 |
| 4,953,960 | A | 9/1990 | Williamson | 359/663 |
| 4,974,919 | A | 12/1990 | Muraki et al. | 359/204 |
| 5,052,763 | A | * 10/1991 | Singh et al. | 359/355 |
| 5,089,913 | A | 2/1992 | Singh et al. | 359/727 |
| 5,194,893 | A | 3/1993 | Nishi | 355/53 |
| 5,212,593 | A | 5/1993 | Williamson et al. | 359/487 |
| 5,220,454 | A | 6/1993 | Ichihara et al. | 359/487 |
| 5,241,423 | A | 8/1993 | Chiu et al. | 359/727 |
| 5,253,110 | A | 10/1993 | Ichihara et al. | 359/619 |
| 5,260,832 | A | 11/1993 | Togino et al. | 359/679 |
| 5,323,263 | A | * 6/1994 | Schoenmakers | 359/366 |
| 5,333,035 | A | 7/1994 | Shiraishi | 355/77 |
| 5,365,051 | A | 11/1994 | Suzuki et al. | 250/201.2 |
| 5,402,267 | A | 3/1995 | Furter et al. | 359/727 |
| 5,406,415 | A | 4/1995 | Kelly | 359/633 |
| 5,414,551 | A | 5/1995 | Okazaki et al. | 359/205 |
| 5,448,408 | A | 9/1995 | Togino et al. | 358/300 |
| 5,506,684 | A | 4/1996 | Ota et al. | 356/401 |
| 5,515,207 | A | 5/1996 | Foo | 359/731 |
| 5,534,970 | A | 7/1996 | Nakashima et al. | 355/53 |
| 5,537,260 | A | 7/1996 | Williamson | 359/727 |
| 5,583,696 | A | 12/1996 | Takahashi | 359/637 |
| 5,591,958 | A | 1/1997 | Nishi et al. | 250/205 |
| 5,592,329 | A | 1/1997 | Ishiyama et al. | 359/399 |
| 5,636,066 | A | 6/1997 | Takahashi | 359/726 |
| 5,668,673 | A | 9/1997 | Suenaga et al. | 359/731 |
| 5,689,377 | A | 11/1997 | Takahashi | 359/727 |
| 5,691,802 | A | 11/1997 | Takahashi | 355/53 |
| 5,694,241 | A | 12/1997 | Ishiyama et al. | 359/364 |
| 5,706,137 | A | 1/1998 | Kelly | 359/633 |
| 5,742,436 | A | 4/1998 | Furter | 359/727 |
| 5,808,805 | A | 9/1998 | Takahashi | 359/651 |
| 6,496,306 | B1 | 12/2002 | Shafer et al. | 359/355 |

OTHER PUBLICATIONS

U.S. patent application Ser. No. 09/709,518, filed Nov. 13, 2000, Hitoshi Matsuzawa et al., Nikon Corporation, Japan.

U.S. patent application Ser. No. 09/659,375, filed Sep. 8, 2000, Tomowaki Takahashi, Nikon Corporation, Japan.

Japanese Publication No. 64–019317 (Jan. 1989) (Abstract only).

Japanese Publication No. 55–012902 (Jan. 1980)(Abstract Only).

* cited by examiner

SPHERICAL ABERRATION
NA=-0.40
Q
P
J
0.010

ASTIGMATISM
Y=7.50
Q
Q
P
P
J
J
0.010

DISTORTION
Y=7.50
0.010

TRANSVERSE ABERRATION
29.99
Q
J
P
RAND
0.001
JPQ
ALL COMA
NA:-0.40
LATERAL CHROMATIC ABERRATION
P
Q
-0.001

SPHERICAL ABERRATION
NA=-0.49
Q
P
J
0.010

ASTIGMATISM
Y=5.49
Q
P
P
J
0.010

DISTORTION
Y=5.49
0.010

LATERAL CHROMATIC ABERRATION
PQ
-0.001

TRANSVERSE ABERRATION
22.00
Q
J
P
20.00
J
Q
P
18.00
J
Q
P
RAND
J
P
Q
0.001
ALL COMA
NA:-0.49

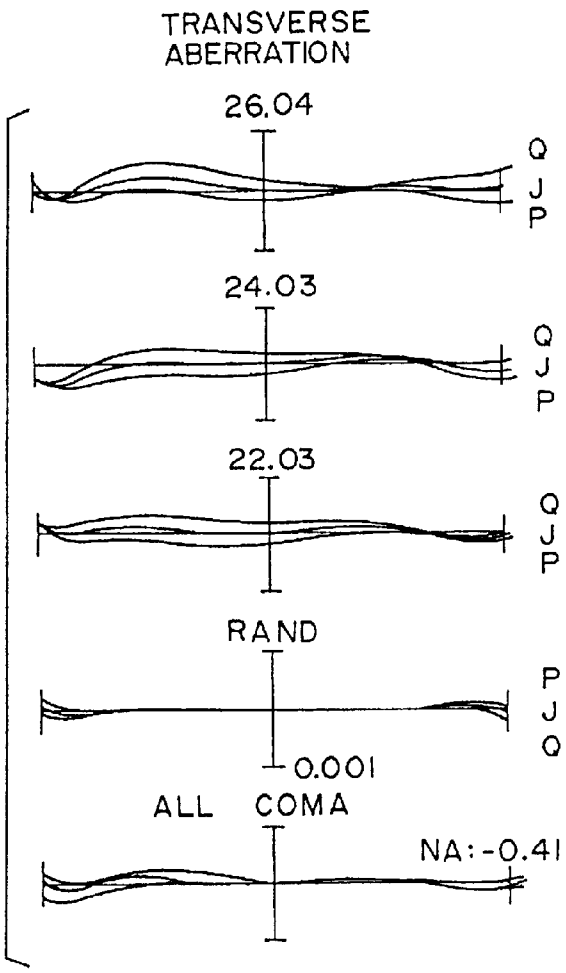
Fig. 24
Fig. 20
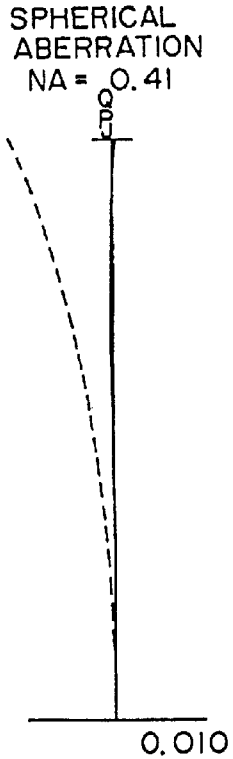
Fig. 21
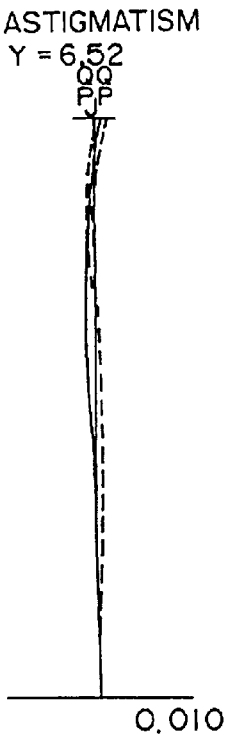
Fig. 22
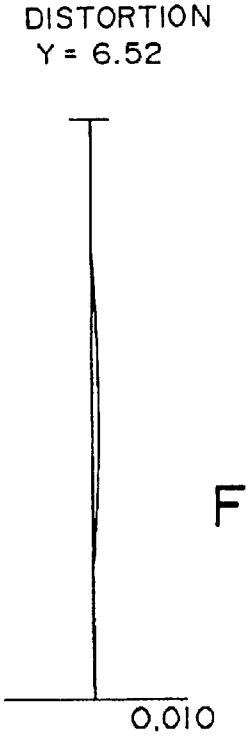
Fig. 23
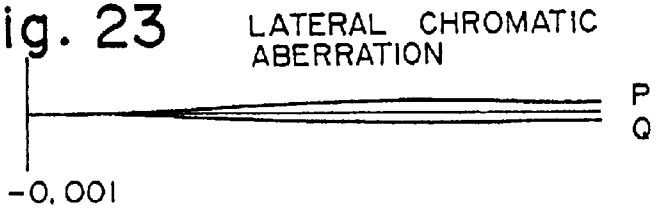

SPHERICAL ABERRATION NA= 0.59
Q
P
J
0.010

ASTIGMATISM Y=5.00
Q Q
P P
J J
0.010

DISTORTION Y=5.00
0.010

LATERAL CHROMATIC ABERRATION
P
Q
-0.001

TRANSVERSE ABERRATION
19.94
P J Q
RAND
0.001
P J Q
ALL COMA
NA=0.59

EXPOSURE APPARATUS HAVING CATADIOPTRIC PROJECTION OPTICAL SYSTEM

Matter enclosed in heavy brackets [ ] appears in the original patent but forms no part of this reissue specification; matter printed in italics indicates the additions made by reissue.

This is a continuation of application Ser. No. 08/429,970 filed Apr. 27, 1995, now U.S. Pat. No. 5,808,805.

BACKGROUND OF THE INVENTION

1. Field of the Invention

The present invention relates to a catadioptric projection optical system suitable for applications to projection optical systems for 1:1 or demagnifying projection in projection exposure apparatus such as steppers used in fabricating, for example, semiconductor devices or liquid crystal display devices, etc., by photolithography process. More particularly, the invention relates to a catadiontric projection optical system of a magnification of ¼ to ⅕ with a resolution of submicron order in the ultraviolet wavelength region, using a reflecting system as an element in the optical system.

2. Related Background Art

In fabricating semiconductor devices or liquid crystal display devices, etc. by photolithography process, the projection exposure apparatus is used for demagnifying through a projection optical system a pattern image on a reticle (or photomask, etc.) for example at a ratio of about ¼ to ⅕ to effect exposure of the image on a wafer (or glass plate, etc.) coated with a photoresist or the like.

The projection exposure apparatus with a catadioptric projection optical system is disclosed, for example, in Japanese Laid-open Patent Application No. 2-66510, Japanese Laid-open Patent Application No. 3-282527, U.S. Pat. No. 5,089,913, Japanese Laid-open Patent Application No. 5-72478, or U.S. Pat. Nos. 5,052,763, 4,779,966, 4,65,77, 4,701,035.

SUMMARY OF THE INVENTION

An object of the present invention is to provide an exposure apparatus having a catadioptric projection optical system which can use a beam splitting optical system smaller than the conventional polarizing beam splitter and which is excellent in image-forming performance, permitting a sufficiently long optical path of from the concave, reflective mirror to the image plane. Therefore, the catadioptric projection optical system has a space permitting an aperture stop to be set therein, based on a size reduction of the beam splitting optical system such as a polarizing beam splitter. The catadioptric projection optical system can be applied to the projection exposure apparatus of the scanning exposure method, based on use of a compact beam splitting optical system. Besides the projection exposure apparatus of the one-shot exposure method, the catadioptric projection optical system can be also applier to recent apparatus employing a scanning exposure method such as the slit scan method or the step-and-scan method, etc. for effecting exposure while relatively scanning the reticle and the wafer to the projection optical system.

To achieve the above object, as shown in FIG. 1, an exposure apparatus of the present invention comprises at least a wafer stage 3 allowing a photosensitive substrate W to be held on a main surface thereof, an illumination optical system 1 for emitting exposure light of a predetermined wavelength and transferring a predetermined pattern of a mask (reticle R) onto the substrate W, a catadioptric projection optical system 5 provided between a first surface P1 on which the mask R is disposed and a second surface P2 to which a surface of the substrate W is corresponded, for projecting an image of the pattern of the mask R onto the substrate W. The illumination optical system 1 includes an alignment optical system 110 for adjusting a relative positions between the mask R and the wafer W, and the mask R is disposed on a reticle stage 2 which is movable in parallel with respect to the main surface of the wafer stage 3. The catadiodtric projection optical system has a space permitting an aperture stop 6 to be set therein. The sensitive substrate W comprises a wafer 8 such as a silicon wafer or a glass plate, etc., and a photosensitive material 7 such as a photoresist or the like coating a surface of the wafer 8.

In particular, as shown in FIGS. 2, 17, and 31, the catadioptric projection optical system comprises a first image-forming optical system ($G_1(f_1)$,$G_2(f_2)$) for forming an intermediate image 11 of the pattern of the mask R, and a second image-forming optical system ($G_3(f_3)$) for forming an image of the intermediate image 11 on the substrate W. The first image-forming optical system has a first group $G_1(f_1)$ with a positive refractive power, comprising a refractive lens component, for converging a light beam from the pattern of the mask R, a second group $G_2(f_2)$ with a positive a refractive power, comprising a concave, reflective mirror $M_2$ for reflecting a light beam from the first group $G_1(f_1)$, for forming the intermediate image 11 of the pattern of the mask R, and a beam splitting optical system 10PBS (including 10A, 10B, and 10C) or *an optical path changing mirror* 12 as a beam splitting optical system for changing a traveling direction of one of a light beam from the first group $G_1(f_1)$ and a reflected light from the concave, reflective mirror $M_2$, and thereby a part of the light beam converged by the second group $G_2(f_2)$ is guided to the second image-forming optical system $G_3(f_3)$. The parameter $f_1$ means as a focus length of the first group $G_1$ in the first image-forming optical system, the parameter $f_2$ means as a focus length of the second group $G_2$ in the first image-forming optical system, and the parameter $f_3$ means as a focus length of a lens group $G_3$ in the second image-forming optical system.

The catadioptric projection optical system in FIG. 2 is an optical system for projecting an image of a pattern of a first surface P1 onto a second surface P2, which has a first image-forming optical system ($G_1$, $G_2$) for forming an intermediate image 11 of the pattern of the first surface P1 and a second image-forming optical system ($G_3$) for forming an image of the intermediate image 11 on the second surface P2.

The first image-forming optical system comprises a first group $G_1(f_1)$ of a positive refractive power, comprising a refractive lens component, for converging a light beam from the pattern of the first surface P1, a prism type beam splitter 10PBS for separating a part of a light beam from the first group by a beam splitter surface 10PBSa arranged obliquely to the optical axis AX1 of the first group, and a second group $G_2(f_2)$ with a positive refractive power, comprising a concave, reflective mirror $M_2$ for reflecting the light beam separated by the prism type beam splitter 10PBS, for forming the intermediate image 11 of the pattern near the prism type beam splitter 10PBS, in which a part of the light beam converged by the second group $G_2(f_2)$ is separated by the prism type beam splitter 10PBS to be guided to the second image-forming optical system $G_3(f_3)$. The prism type beam splitter is disposed on the optical axis AX1 of the first group $G_1(f_1)$ and provided between the concave, reflective mirror $M_2$ and the second image-forming optical system.

In this case, it is desirable that the intermediate image 11 of the pattern be formed inside the prism type beam splitter 10PBS. Also, as shown in FIG. 2, it is desired that in order to prevent generation of flare due to repetitive reflections between the concave, reflective mirror $M_2$ and the second surface P2, a polarizing b spit-per be used as the beam splitter 10PBS and a quarter wave plate 9 be placed between the polarizing beam splitter and the concave, reflective mirror $M_2$. Further, it is desired that the optical system be telecentric at least on the image plane P2 side.

Next, the catadioptric projection optical system in FIG. 17 is an optical system for projecting an image of a pattern P10 on a first surface P1 onto a second surface P2 which has a first image-forming optical system ($G_1(f_1)$, $G_2(f_2)$). for forming an intermediate image 11 of the pattern P10 of the first surface P1, and a second image-forming optical system ($G_3(f_3)$) forming an image of the intermediate image 11 on the second surface P2.

The first image-forming optical system comprises a first group $G_1(f_1)$ of a positive refractive power, comprising a refractive lens component, for converging a light beam from the pattern P10 of the first surface P1, a partial mirror 12 for separating a part of the light beam from the first group by a first reflective surface 12a arranged obliquely to the optical axis AX1 of the first group, and a second group $G_2(f_2)$ of a positive refractive power, comprising a concave, reflective mirror $M_2$ for reflecting the light beam of which the part is separated by the partial mirror 12, for forming the intermediate image 11 of the pattern P10 near the partial mirror 12, in which a Dart of the light beam converged by the second group is guided to the second image-forming optical system $G_3(f_3)$. The partial mirror 12 is positioned so as to avoid being disposed on the optical axis AX1 of the first group and provided between the first group and the second group. The partial mirror 12 further has a second reflective surface for guiding the reflected light beam from the concave, reflective mirror $M_2$ to the second image-forming optical system, the second reflective surface 12b being opposite to the first reflective surface 12a.

In this case, because the light beam reflected by a second surface 12b of the partial mirror 12 is used, it is desired that an image-forming range be slit or arcuate. Namely, the catadioptric projection optical system in FIG. 17 is suitable for applications to the projection exposure apparatus of the scanning exposure method. In this case, because the use of the partial mirror 12 includes little influence of repetitive reflections, the quarter wave plate can be obviated.

In these arrangements, the following conditions should be preferably satisfied when individual Petzval sums of the first group $G_1(f_1)$, the second group $G_2(f_2)$, and the second image-forming optical system $G_3(f_3)$ are $P_1$, $P_2$, $P_3$, respectively.

$$p_1+p_3>0 \quad (1)$$

$$p_2<0 \quad (2)$$

$$|p_1+p_2+p_3|<0.1 \quad (3)$$

Further, the following conditions should be preferably satisfied when a magnification of primary image formation of from the pattern on the first surface P1 to the intermediate image is $\beta_{12}$, a magnification of secondary image formation of from the intermediate image to the image on the second surface P2 is $\beta_3$, and a magnification of from the first surface to the second surface is $\beta$.

$$0.1\leqq|\beta_{12}|\leqq0.5 \quad (4)$$

$$0.25\leqq|\beta_3\leqq2 \quad (5)$$

$$0.1\leqq|\beta|\leqq0.5 \quad (6)$$

The catadioptric projection optical system in FIG. 2 is suitably applicable to the projection exposure apparatus of the one-shot exposure method. In this case, because the prism type beam splitter 10PBS is used to separate the light beam coming from the concave, reflective mirror $M_2$ from the light beam going to the concave, reflective mirror $M_2$ and because the beam splitter 10PBS is located near the portion where the light beam from the concave, reflective mirror $M_2$ is once converged to be focused, the prism type beam splitter 10PBS can be constructed in a reduced scale. In other words, in the catadioptric projection optical system, since an intermediate image 11 of the pattern of the first surface P1 is formed between the concave, reflective mirror $M_2$ and the second image-forming optical system, the diameter of the light beam traveling from the concave, reflective mirror $M_2$ to the beam splitter 10PBS will become small.

Also, because the image is once formed between the concave, reflective mirror $M_2$ and the image plane P2, an aperture stop 6 can be placed in the second image-forming optical system $G_3(f_3)$. Accordingly, a coherence factor ($\sigma$value) can be readily controlled. With regard to this, because after the primary image formation, the secondary image formation is made by the second image-forming optical system $G_3(f_3)$, the working distance between a fore end lens in the second image-forming optical system $G_3(f_3)$ and the image plane P2 can be secured sufficiently long. In particular, because the projection exposure apparatus of the one-shot exposure method employs the beam splitter 10PBS located near the plane of primary image formation, the beam splitter 10PBS can be made as small as possible.

Next, because the catadioptric projection optical system in FIG. 17 uses the partial mirror 12, a best image region on the image plane P2 is slit or arcuate, thus being suitable for applications to the projection exposure apparatus of the scanning exposure method. In this case, because the image is once formed near the partial mirror 12, the partial mirror 12 may be small in size and characteristics of a reflective film of the partial mirror 12 are stable.

Also, the optical path can be separated simply by providing the partial mirror 12 with a small angle of view. Namely, because a large angle of view is unnecessary for separation of the optical path, a sufficient margin is left in the image-forming performance. With regard to this, ordinary catadioptric projection optical systems need a maximum angle of view of about 20° or more for separation of the optical path, while an angle of view of the light beam entering the partial mirror 12 is about 10°, which is easy in aberration correction.

A so-called ring field optical system is known as a projection optical system for the scanning exposure method, and the ring field optical system is constructed to illuminate only an off-axis annular portion. It is, however, difficult for the ring field optical system to have a large numerical aperture, because it uses an off-axis beam. Further, because optical members in that system are not symmetric with respect to the optical axis, processing, inspection, and adjustment of the optical members are difficult, and accuracy control or accuracy maintenance is also difficult. In contrast with it, because the angle of view is not large in the present invention, the optical system is constructed in a structure with less eclipse of beam.

Since the first image-forming optical system ($G_1(f_1)$, $G_2(f_2)$) and the second image-forming optical system $G_3(f_3)$ are constructed independently of each other, the optical system is easy in processing, inspection, and adjustment of optical members, is easy in accuracy control and accuracy maintenance, and has excellent image-forming characteristics to realize a large numerical aperture.

Next, in the catadioptric projection optical system shown in FIG. 2 or 17, a Petzval sum of the entire optical system first needs to be set as close to 0, in order to further improve the performance of optical system. Therefore, conditions of equations (1) to (3) should be preferably satisfied.

Satisfying the conditions of equations (1) to (3) prevents curvature of the image plane in the optical performance, which thus makes flatness of the image plane excellent. Above the upper limit of the condition of equation (3) (or if $p_1+P_2+P_3 \geqq 0.1$), the image plane is curved as concave to the object plane; below the lower limit of the condition of equation (3) (or if $p_1+p_2p_3 \leqq 0.1$), the image plane is curved as convex to the object, thereby considerably degrading the image-forming performance.

When the conditions of equations (4) to (6) are satisfied as to the magnification $\beta_{12}$ of primary image formation, the magnification $\beta_3$ of secondary image formation, and the magnification $\beta$ of overall image formation, the optical system can be constructed without difficulties. Below the lower limit of each condition of equation (4) to (6), the demagnifying ratio becomes excessive, which makes wide-range exposure difficult. Above the upper limit, the demagnifying ratio becomes closer to magnifying ratios, which is against the original purpose of use for reduction projection in applications to the projection exposure apparatus.

In this case, because the condition of equation (4) is satisfied, the most Dart of the demagnifying ratio of the overall optical system relies on the first image-forming optical system. Accordingly, the beam splitter 10PBS or the partial mirror 12 can be constructed in a small scale in particular. If the position of the beam splitter 10PBS in FIG. 2 or the partial mirror 12 in FIG. 6 as beam splitting means is made nearly coincident with the entrance pupil and the exit pupil of optical system, a shield portion on the pupil does not change against a change of object height, and therefore, no change of image-forming performance appears across the entire image plane.

Also, it is desired that such an optical system for exposure be telecentric at least on the image plane side in order to suppress a change of magnification against variations in the direction of the optical axis, of the image plane where the wafer or the like is located.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIGS. 19 to 24 are aberration diagrams of the third embodiment.

DETAILED DESCRIPTION OF THE PREFERRED EMBODIMENTS

Figure 1:
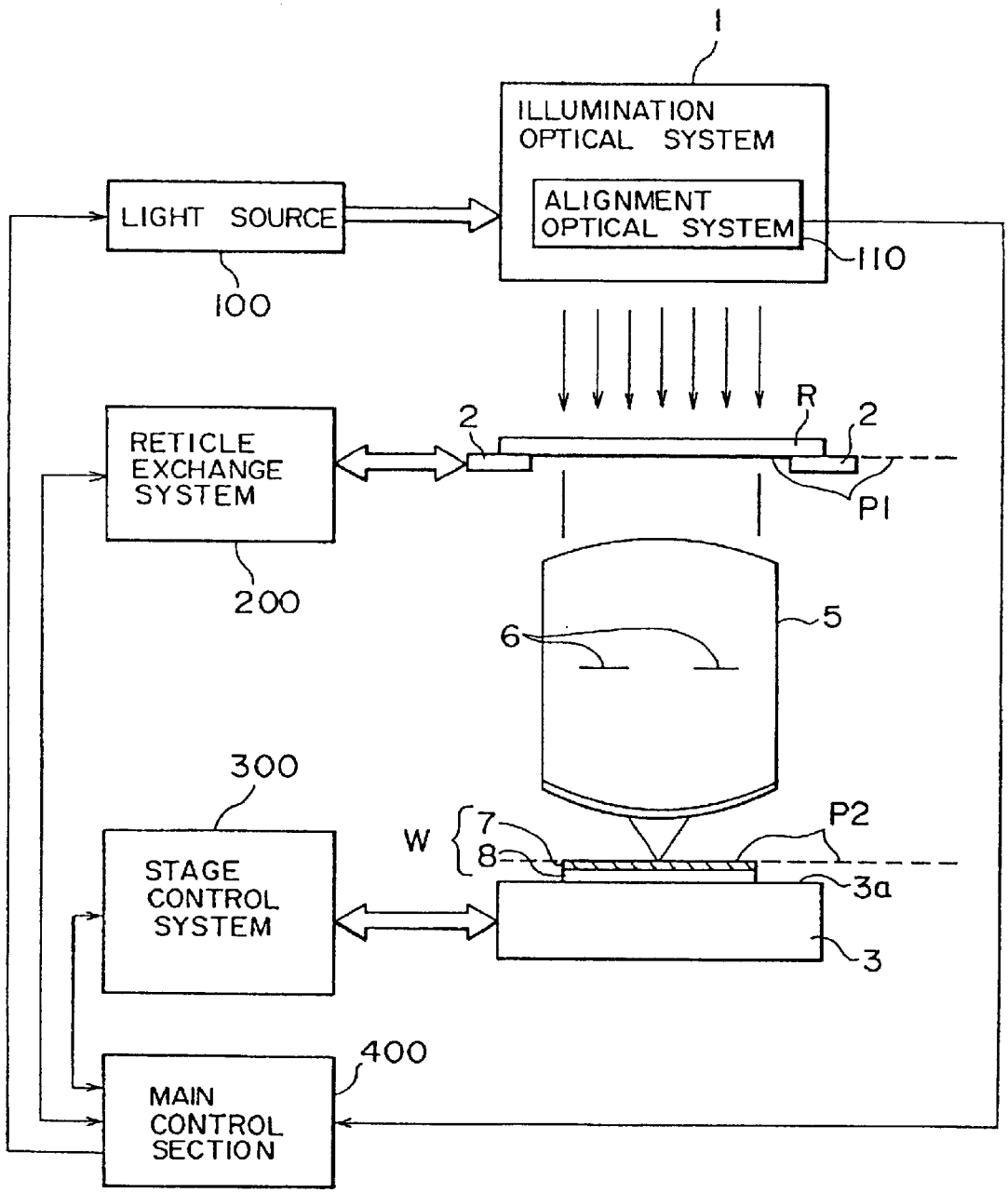
FIG. 1 is a structural drawing to show the basic structure of the exposure apparatus according to the present invention.

Various embodiments of the catadioptric projection optical system according to the present invention will be described with reference to the drawings. In the examples, the present invention is applied to the projection optical system in the projection exposure apparatus for projecting an image of patterns of reticle onto a wafer coated with a photoresist. FIG. 1 shows a basic structure of the exposure apparatus according to the present invention. As shown in FIG. 1, an exposure apparatus of the present invention comprises at least a wafer stage 3 allowing a photosensitive substrate W to be held on a main surface 3a thereof, an illumination optical system 1 for emitting exposure light of a predetermined wavelength and transferring a predetermined pattern of a mask (reticle R) onto the substrate W, a light source 100 for supplying an exposure light to the illumination optical system 1, a catadioptric Projection optical system 5 provided between a first surface P1 (object plane) on which the mask R is disposed and a second surface P2 (image plane) to which a surface of the substrate W is corresponded, for projecting an image of the pattern of the mask R onto the substrate W. The illumination optical system 1 includes an alignment optical system 110 for adjusting a relative positions between the mask R and the wafer W, and the mask R is disposed on a reticle stage 2 which is movable in parallel with respect to the main surface of the wafer stage 3. A reticle exchange system 200 conveys and changes a reticle (mask R) to be set on the reticle stage 2. The reticle exchange system 200 includes a stage driver for moving the reticle stage 2 in parallel with respect to the main surface 3a of the wafer stage 3. The catadioptric projection optical system 5 has a space permitting an aperture stop 6 to be set therein. The sensitive substrate W comprises a wafer 8 such as a silicon wafer or a glass plate, etc., and a photosensitive material 7 such as a photoresist or the like coating a surface of the wafer 8. The wafer stage 3 is moved in parallel with respect to a object plane P1 by a stage control system 300. Further, since a main control section 400 such as a computer system controls the light source 100, the reticle exchange system 200, the stage control system 300 or the like, the exposure apparatus can perform a harmonious action as a whole.

The techniques relating to an exposure apparatus of the present invention are described, for example, in U.S. patent applications Ser. No. 255,927 (*which issued as U.S. Pat. No. 5,534,970*), 260,398 (*which issued as U.S. Pat. No. 5,591,958*), 299,305 (*which issued as U.S. Pat. No. 5,506,684*), U.S. Pat. Nos. 4,497,015, 4,666,273, 5,194,893, 5,253,110, 5,333,035, 5,365,051, 5,379,091, or the like. The reference of U.S. patent application Ser. No. 255,927 (*which issued as U.S. Pat. No. 5,534,970*)teaches an illumination optical system (using a laser source) applied to a scan type exposure apparatus. The reference of U.S. patent application Ser. No. 260,398 (*which issued as U.S. Pat. No. 5,591,958*)teaches an illumination optical system (using a lamp source) applied to a scan type exposure apparatus. The reference of U.S. patent application Ser. No. 299,305 (*which issued as U.S. Pat. No. 5,506,684*)teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 reaches a step-and repeat type exposure apparatus capable of using the catadioptric projection optical system of the present invention.

The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U.S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus.

Figure 4:
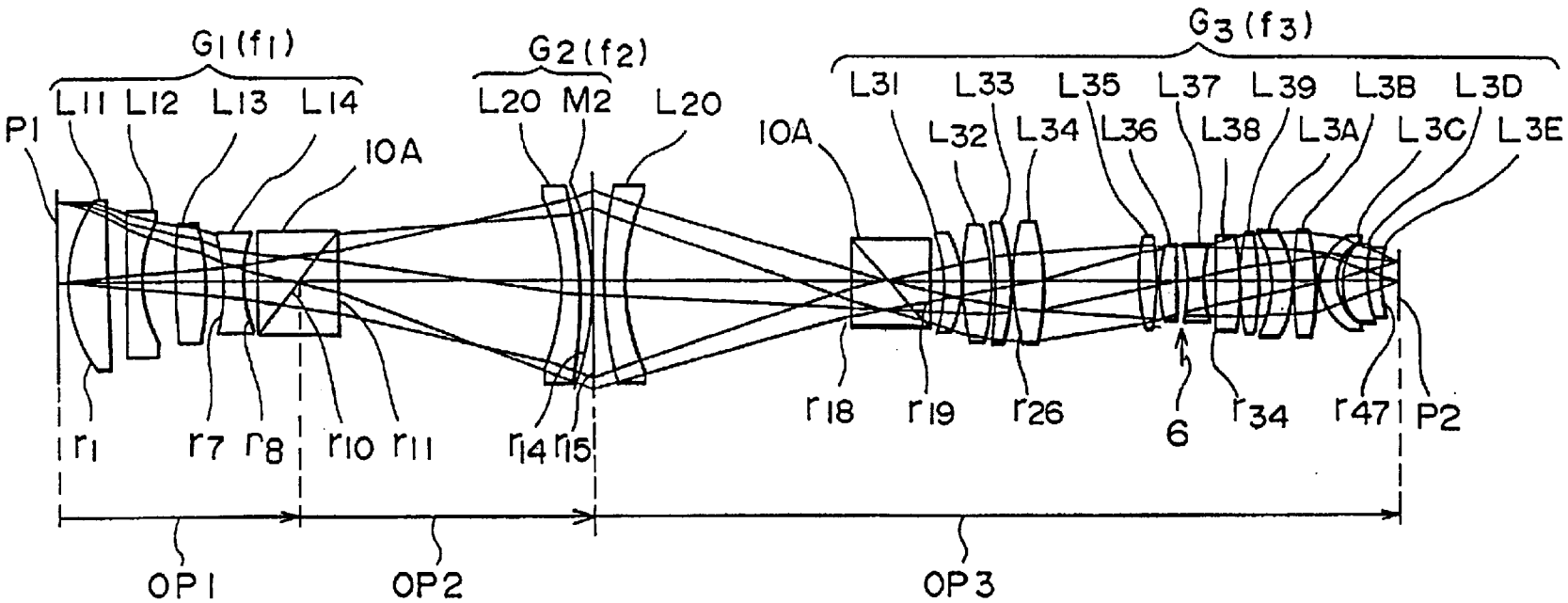
FIG. 4 is an optical path development of a first embodiment of the catadioptric projection optical system in FIG. 2, the optical path comprising the optical paths OP1, OP2, OP3 shown in FIG. 3.

In each embodiment as described below, a lens arrangement is illustrated as an optical path development, for example as shown in FIG. 4. In each optical path development, a reflective surface is shown as a transmissive surface, and optical elements are arranged in the order in which light from reticle R passes. Also, a virtual plane of flat surface (for example $r_{15}$) is used at a reflective surface of a concave, reflective mirror (for example $r_{14}$). In order to indicate a shape and separation of lens, for example as shown in FIG. 4, the pattern surface of reticle R is defined as the zeroth surface, surfaces that the light emergent from the reticle R passes in order before reaching the wafer W are defined as i-th surfaces (i=1, 2, . . . ), and the sign for radii ri of curvature of the i-th surfaces is determined as positive if a surface is convex to the reticle 10 in the optical path development. A surface separation between the i-th surface and the (i+b 1)-th surface is defined as $d_i$. $SiO_2$ as a glass material means silica class. A refractive index of silica glass for reference wavelength (193 nm) used is as follows.

silica glass: 1.56100

First Embodiment

The first embodiment is a projection optical system with a magnification of ¼×, suitably applicable to the projection exposure apparatus of the one-shot exposure method (steppers etc.). This first embodiment is an embodiment corresponding to the optical system of FIG. 2 as well. FIG. 4 is an optical path development of the projection optical system of the first embodiment. As shown in FIG. 4, light from the patterns on the reticle R travels through a first converging group $G_1$ consisting of four refractive lenses and then is reflected by a beam splitter surface ($r_{10}$) in a cubic polarizing beam splitter 10A. An optical path of the light is corresponded to the optical path OP1 in FIG. 3. The reflected light passes through a quarter wave plate 9 (not shown in FIG. 4) to reach a second converging group $G_2$ consisting of a negative meniscus lens $L_{20}$ and a concave, reflective mirror $M_2$. The light reflected by the second converging group $G_2$ passes through the quarter wave plate (not shown in FIG. 4) to form an intermediate image of the patterns in the polarizing beam splitter 10A (see optical paths OP2 and OP3 in FIG. 4).

Then, light from the intermediate image, that is, a light beam having passed through the polarizing beam splitter 10A, then passes through a third converging group $G_3$ consisting of fourteen refractive lenses to form a second intermediate image of the patterns on the surface of wafer W. In this case, an aperture stop 6 is placed on a Fourier transform plane in the third converging group $G_3$, i.e., between a positive meniscus lens $L_{36}$ and a concave lens $L_{37}$.

Also, as shown in FIG. 4, the first converging group $G_1$ is composed of, in the order from the reticle R side, a positive meniscus lens $L_{11}$ with a convex surface to the reticle R, a negative meniscus lens $L_{12}$ with a convex surface to the reticle R, a double convex lens (hereinafter referred to simply as "convex lens") $L_{13}$, and a double concave lens (hereinafter referred to simply as "concave lens") $L_{14}$, and the second converging group $G_2$ is composed of a negative meniscus lens $L_{20}$ with a concave surface to the reticle R and a concave, reflective mirror $M_2$. Further, the third converging group $G_3$ is composed of a positive meniscus lens $L_{31}$ with a concave surface to the reticle R, a convex lens $L_{32}$, a positive meniscus lens $L_{33}$ with a concave surface to the reticle R, a convex lens $L_{34}$, a convex lens $L_{35}$, a positive meniscus lens $L_{36}$ with a convex surface to the reticle R, a concave lens $L_{37}$, a convex lens $L_{38}$, a convex lens $L_{39}$, a negative meniscus lens $L_{3A}$ with a concave surface to the reticle R, a convex lens $L_{3B}$, a negative meniscus lens $L_{3C}$ with a convex surface to the reticle R, a positive meniscus lens $L_{3D}$ with a convex surface to the reticle R, and a negative meniscus lens $L_{3E}$ with a convex surface to the reticle R.

A magnification of the total system is ¼×(demagnification), a numerical aperture NA on the wafer W side (image side) is 0.4, and the object height is 30 mm.

The refractive lenses all are made of a kind of optical glass of fused quartz, which are corrected For axial and lateral chromatic aberrations for a wavelength band of 1 nm at the wavelength of 193 nm of the ultraviolet excimer laser light. Also, the optical system has excellent image-forming performance, as well corrected for spherical aberration, coma, astigmatism, and distortion up to a nearly zero aberration slate, and the good image-forming performance can be retained even if the optical system of FIG. 4 is proportionally enlarged two to three times.

Next Table 1 shows radii of curvature $r_i$, surface separations $d_i$, and glass materials in the first embodiment of FIG. 4. In the following table, the fifteenth surface is a virtual plane for indicating the concave, reflective mirror in the optical path development.

TABLE 1

| i | $r_i$ | $d_i$ | Glass Material |
|---|---|---|---|
| 0 | — | 2.2 | |
| 1 | 45.87 | 15.0 | $S_iO_2$ |
| 2 | 321.75 | 7.5 | |
| 3 | 4161.48 | 6.0 | $S_iO_2$ |
| 4 | 56.56 | 11.7 | |
| 5 | 243.98 | 10.0 | $S_iO_2$ |
| 6 | −89.98 | 7.3 | |
| 7 | −50.58 | 6.0 | $S_iO_2$ |
| 8 | 46.80 | 5.0 | |
| 9 | ∞ | 30.0 | $S_iO_2$ |
| 10 | ∞ | 52.6 | |
| 11 | ∞ | 27.0 | |
| 12 | −76.04 | 6.9 | $S_iO_2$ |
| 13 | −140.44 | 4.1 | |
| 14 | −89.27 | 0.0 | |
| 15 | ∞ | 4.1 | |
| 16 | 140.44 | 6.9 | $S_iO_2$ |
| 17 | 76.04 | 79.6 | |
| 18 | ∞ | 30.0 | $S_iO_2$ |
| 19 | ∞ | 5.0 | |
| 20 | −41.51 | 6.0 | $S_iO_2$ |
| 21 | −39.50 | 1.0 | |
| 22 | 244.39 | 10.0 | $S_iO_2$ |
| 23 | −64.38 | 1.0 | |
| 24 | −140.60 | 6.0 | $S_iO_2$ |
| 25 | −82.20 | 1.0 | |
| 26 | 146.49 | 9.4 | $S_iO_2$ |
| 27 | −114.12 | 32.9 | |
| 28 | 84.53 | 6.0 | $S_iO_2$ |
| 29 | −182.36 | 1.0 | |
| 30 | 48.17 | 6.0 | $S_iO_2$ |
| 31 | 194.47 | 4.0 | |
| 32 | −48.51 | 5.6 | $S_iO_2$ |
| 33 | 58.04 | 4.3 | |
| 34 | 207.40 | 8.2 | $S_iO_2$ |
| 35 | −118.99 | 0.3 | |
| 36 | 103.13 | 8.2 | $S_iO_2$ |
| 37 | −61.92 | 3.7 | |
| 38 | −38.44 | 6.7 | $S_iO_2$ |
| 39 | −42.44 | 1.0 | |
| 40 | 308.23 | 8.0 | $S_iO_2$ |
| 41 | −71.28 | 1.0 | |
| 42 | 19.58 | 5.7 | $S_iO_2$ |
| 43 | 16.97 | 2.5 | |
| 44 | 19.43 | 8.0 | $S_iO_2$ |
| 45 | 51.61 | 0.5 | |
| 46 | 108.17 | 3.7 | $S_iO_2$ |
| 47 | 39.10 | 0.7 | |

Figures 5, 6, 7, 8, 9:
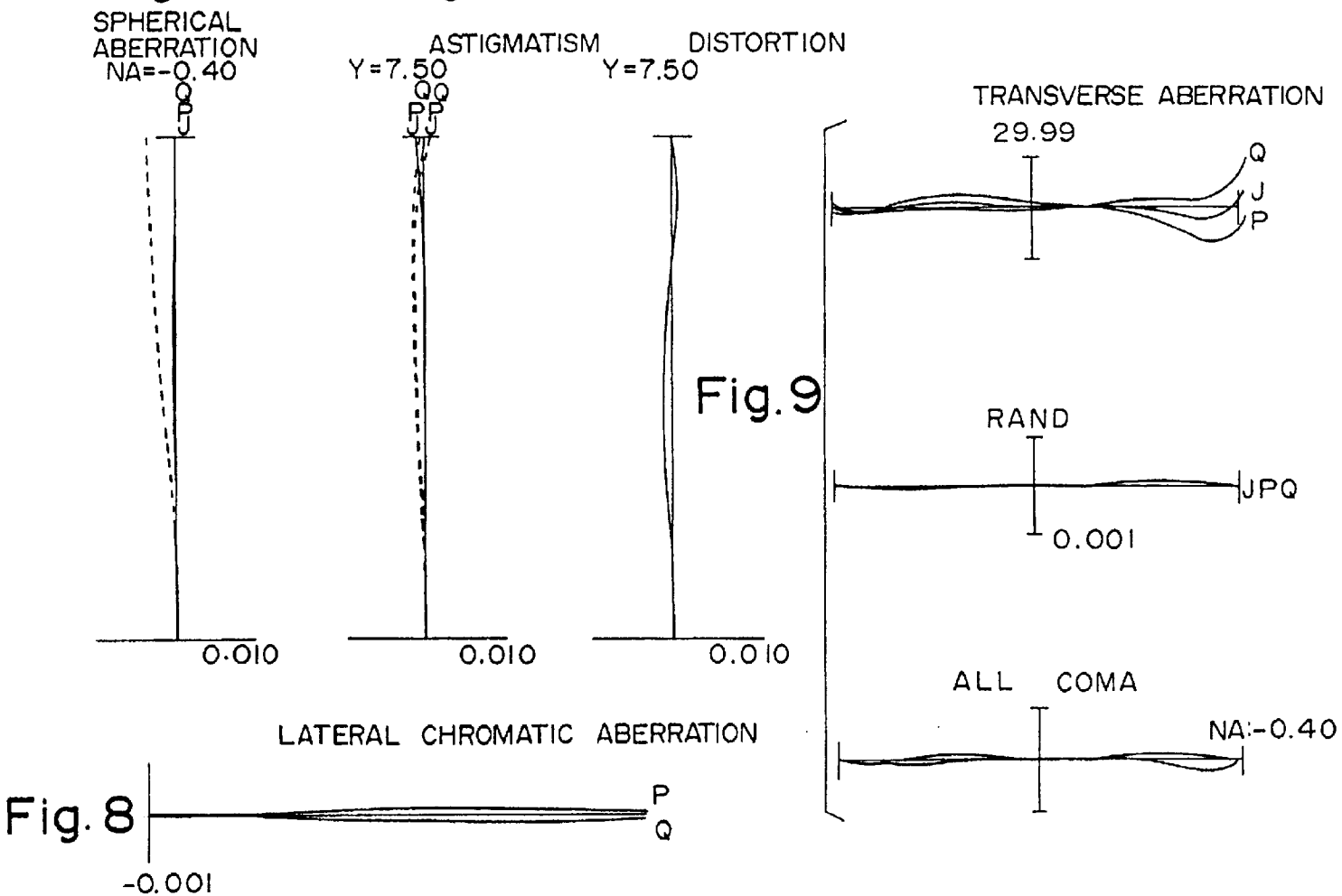
FIGS. 5 to 9 are aberration diagrams of the first embodiment.

Also, FIGS. 5 to 7 show longitudinal aberration diagrams of the first embodiment, FIG. 8 shows a lateral chromatic aberration diagram of the first embodiment, and FIG. 9 shows transverse aberration diagrams of the first embodiment. In particular, FIG. 5 shows spherical aberration or the first embodiment, FIG. 6 shows astigmatism of the first embodiment, and FIG. 7 shows distortion or the first embodiment. In these aberration diagrams, symbols j, P, and Q represent respective characteristics when the used wavelength is changed in a selected range with respect to the reference wavelength. It is seen from these aberration diagrams that though the numerical aperture is large, 0.4, in this example, the aberrations are well corrected in a wide image circle region. Further, chromatic aberration is well corrected as well.

Second Embodiment

Figures 10, 11:
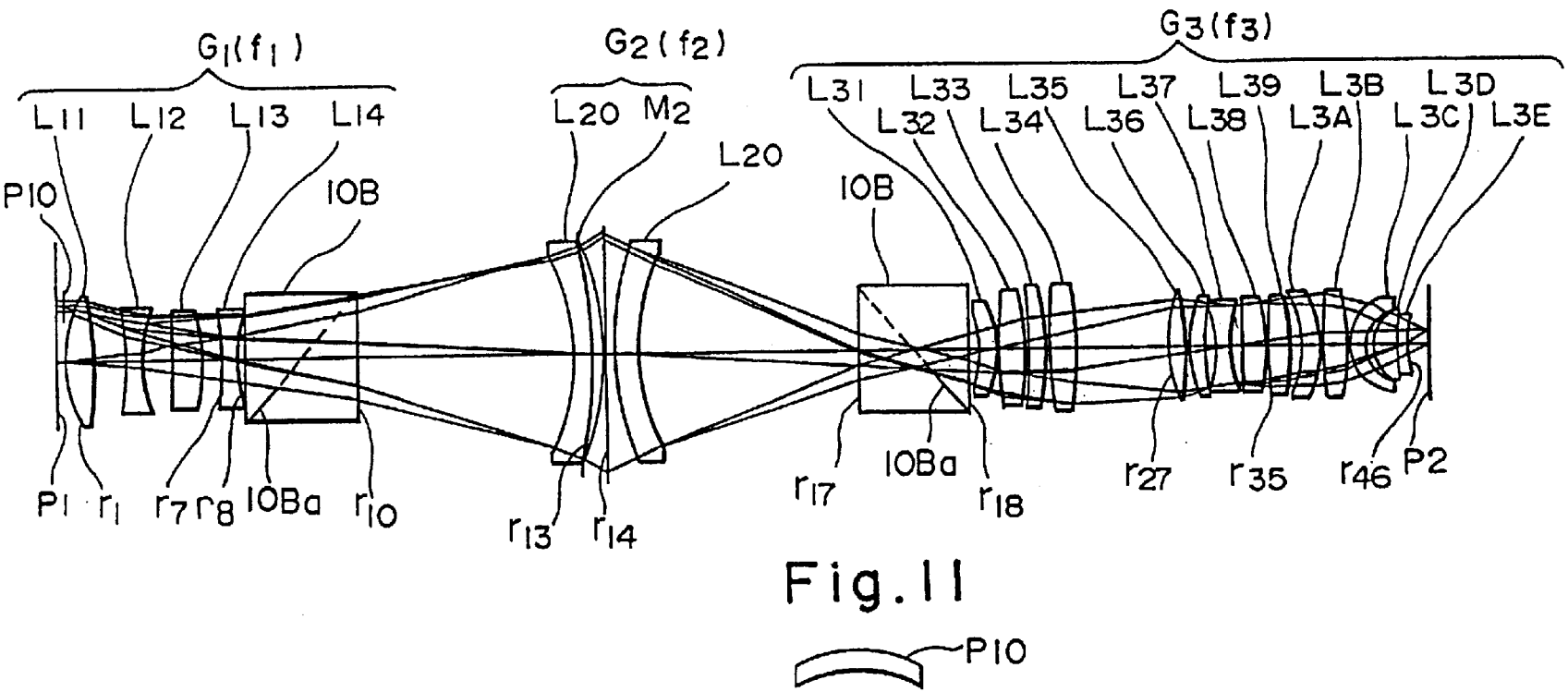
FIG. 10 is an optical path development of the projection optical system in the second embodiment.
FIGS. 11 to 16 are aberration diagrams of the second embodiment.

The second embodiment is a projection optical system with a magnification of ¼×, suitably applicable to the projection exposure apparatus of the scanning exposure method. This second embodiment is an embodiment as a modification of the optical system of FIG. 2 as well. FIG. 10 is an optical path development of the projection optical system of the present embodiment, and FIG. 11 shows an illumination area on the reticle R. As shown in this FIG. 11, an arcuate illumination area P10 on the reticle R is illuminated by an illumination optical system not shown. Then, in FIG. 10, light from patterns in the illumination area P10 on the reticle R travels through a first converging group G consisting of four refractive lenses, and then passes a transmissive part of a junction surface in a cubic, partially-reflective, beam splitter 10B. A reflective film 10Ba with a reflectivity of approximately 100% is formed in a peripheral part of the junction surface of the partially-reflective beam splitter 10B, and a portion other than this reflective film 10Ba is a transmissive surface with a transmittance of approximately 100%.

The reflected light reaches a second converging group $G_2$ consisting of a negative meniscus lens $L_{20}$ and a concave, reflective mirror $M_2$, and light reflected by the second converging group $G_2$ forms an intermediate image of the patterns in the illumination area P10, near the reflective film 10Ba in the partially-reflective beam splitter 10B. Then light from the intermediate image is reflected by the reflective film 10Ba, then passes through a third converging group $G_3$ consisting of fourteen refractive lenses, and forms a second intermediate image of the patterns on the surface of wafer W. Letting β be a projection magnification of from reticle R to wafer W, the reticle area R is scanned upward at a predetermined velocity $V_R$ and in synchronization therewith the wafer W is scanned upward at a velocity $\beta \cdot V_R$, thus carrying out exposure in the scanning exposure method.

Also, as shown in FIG. 10, the first converging group $G_1$ is composed of, in the order from the reticle R side, a convex lens $L_{11}$, a concave lens $L_{12}$, a positive meniscus lens $L_{13}$ with a concave surface to the reticle R, and a concave lens $L_{14}$, and the second converging group $G_2$ is composed of a negative meniscus lens $L_{20}$ with a concave surface to the reticle R and a concave, reflective mirror $M_2$. Further, the third converging group $G_3$ is composed of a positive meniscus lens L with a concave surface to the reticle R, a convex lens $L_{32}$, a positive meniscus lens $L_{33}$ with a concave surface to the reticle R, a convex lens $L_{34}$, a convex lens $L_{35}$, a positive meniscus lens $L_{36}$ with a convex surface to the reticle R, a concave lens $L_{37}$, a positive meniscus lens $L_{38}$ with a concave surface to the reticle 10, a convex lens $L_{39}$, a negative meniscus lens $L_{3A}$ with a concave surface to the reticle R, a convex lens $L_{3B}$, a negative meniscus lens $L_{3C}$ with-a convex surface to the reticle R, a positive meniscus lens $L_{2D}$ with a convex surface to the reticle R, and a negative meniscus lens $L_{3E}$ with a convex surface to the reticle R.

A magnification of the total system is ¼×(demagnification), a numerical aperture NA on the wafer W side (image side) is 0.5, and the object height is 22 mm. The optical system may be used in the one-shot exposure method.

The refractive lenses all are made of a kind of optical glass of fused quartz, which are corrected for axial and lateral chromatic aberrations for a wavelength band of 1 nm at the wavelength of 193 nm of the ultraviolet excimer laser light. Also, the optical system has excellent image-forming performance, as well corrected for spherical aberration, coma, astigmatism, and distortion up to a nearly zero aberration state.

Next Table 2 shows radii of curvature $r_i$, surface separations $d_i$ and glass materials in the second embodiment of FIG. 10. In the following table, the fourteenth surface is a virtual plane for indicating the concave, reflective mirror in the optical path development.

TABLE 2

| i | $r_i$ | $d_i$ | Glass Material |
|---|---|---|---|
| 0 | — | 2.2 | |
| 1 | 45.63 | 10.0 | $S_iO_2$ |
| 2 | −183.72 | 12.0 | |
| 3 | −91.37 | 6.0 | $S_iO_2$ |
| 4 | 47.38 | 11.7 | |
| 5 | −221.10 | 10.0 | $S_iO_2$ |
| 6 | −98.95 | 7.3 | |
| 7 | −110.83 | 6.0 | $S_iO_2$ |
| 8 | 66.11 | 3.0 | |
| 9 | ∞ | 40.0 | $S_iO_2$ |
| 10 | ∞ | 77.7 | |
| 11 | −78.96 | 7.2 | $S_iO_2$ |
| 12 | −145.84 | 4.3 | |
| 13 | −92.70 | 0.0 | |
| 14 | ∞ | 4.3 | |
| 15 | 145.84 | 7.2 | $S_iO_2$ |
| 16 | 78.96 | 77.7 | |
| 17 | ∞ | 40.0 | $S_iO_2$ |
| 18 | ∞ | 4.0 | |
| 19 | −40.58 | 6.0 | $S_iO_2$ |
| 20 | −36.69 | 1.0 | |
| 21 | 212.61 | 10.0 | $S_iO_2$ |
| 22 | −65.47 | 1.0 | |
| 23 | −134.41 | 6.0 | $S_iO_2$ |
| 24 | −75.11 | 1.0 | |
| 25 | 319.62 | 9.4 | $S_iO_2$ |
| 26 | −119.09 | 32.9 | |
| 27 | 56.25 | 6.0 | $S_iO_2$ |
| 28 | −120.67 | 1.0 | |
| 29 | 49.04 | 6.0 | $S_iO_2$ |
| 30 | 99.71 | 4.0 | |
| 31 | −48.50 | 5.6 | $S_iO_2$ |
| 32 | 54.15 | 4.3 | |
| 33 | −361.48 | 8.2 | $S_iO_2$ |
| 34 | −76.92 | 0.3 | |
| 35 | 145.52 | 8.2 | $S_iO_2$ |
| 36 | −71.54 | 3.7 | |
| 37 | −37.19 | 6.7 | $S_iO_2$ |
| 38 | −41.33 | 1.0 | |
| 39 | 194.05 | 8.0 | $S_iO_2$ |
| 40 | −62.51 | 1.0 | |
| 41 | 17.77 | 5.7 | $S_iO_2$ |
| 42 | 13.88 | 2.5 | |
| 43 | 17.52 | 8.0 | $S_iO_2$ |
| 44 | 93.95 | 0.5 | |
| 45 | 98.19 | 3.7 | $S_iO_2$ |
| 46 | 31.30 | 7.0 | |

Figures 12, 13, 14, 15, 16:
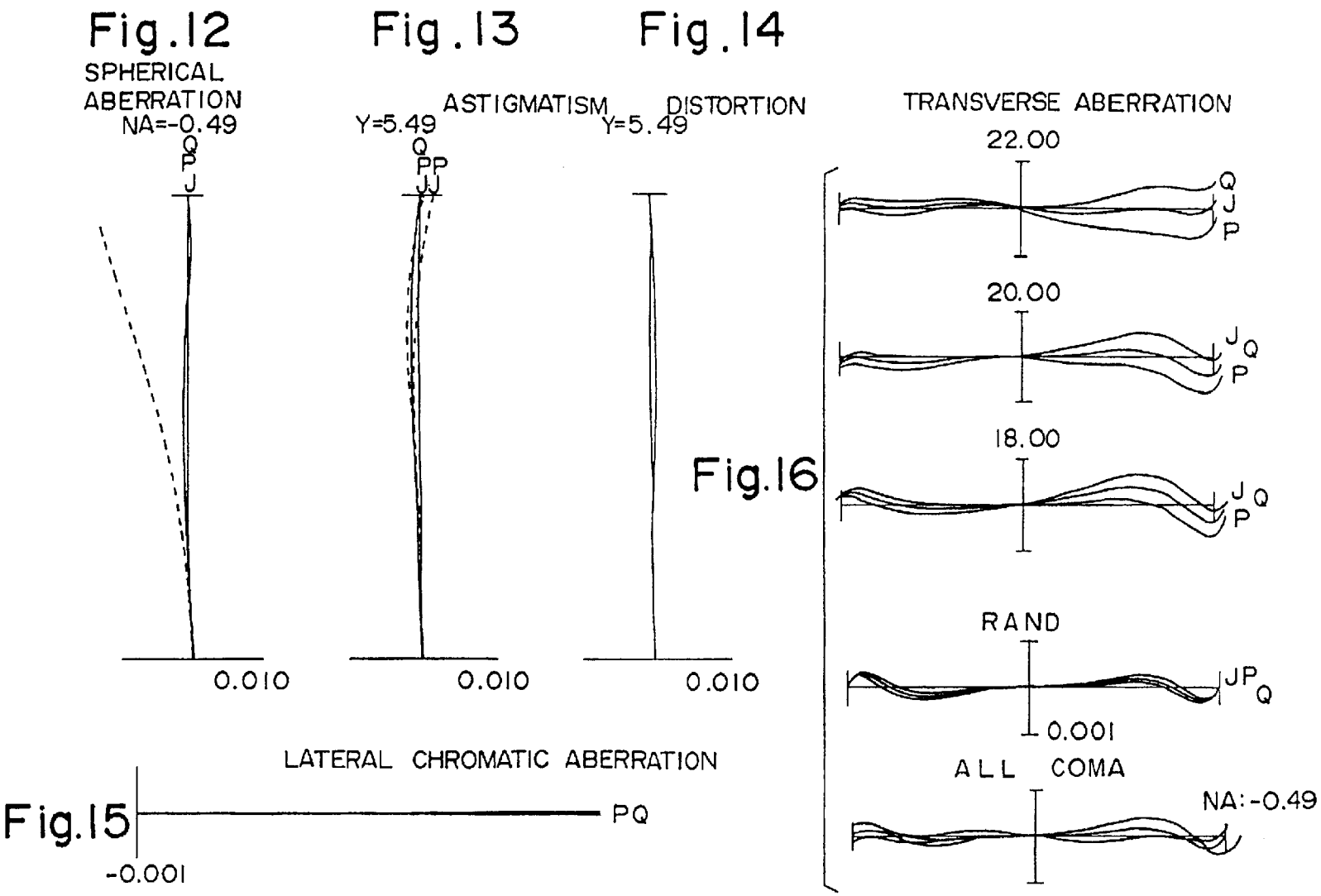

Also, FIGS. 12 to 14 show longitudinal aberration diagrams of the second embodiment, FIG. 15 shows a lateral chromatic aberration diagram of the second embodiment, and FIG. 16 shows transverse aberration diagrams of the second embodiment. In particular, FIG. 12 shows spherical aberration of the second embodiment, FIG. 13 shows astigmatism of the second embodiment, and FIG. 14 shows distortion of the second embodiment. It is seen from these aberration diagrams that although the numerical aperture is large as 0.5 in this example, the aberrations are well corrected in a wide image circle region. Further, chromatic aberration is well corrected as well.

Third Embodiment

Figure 17:
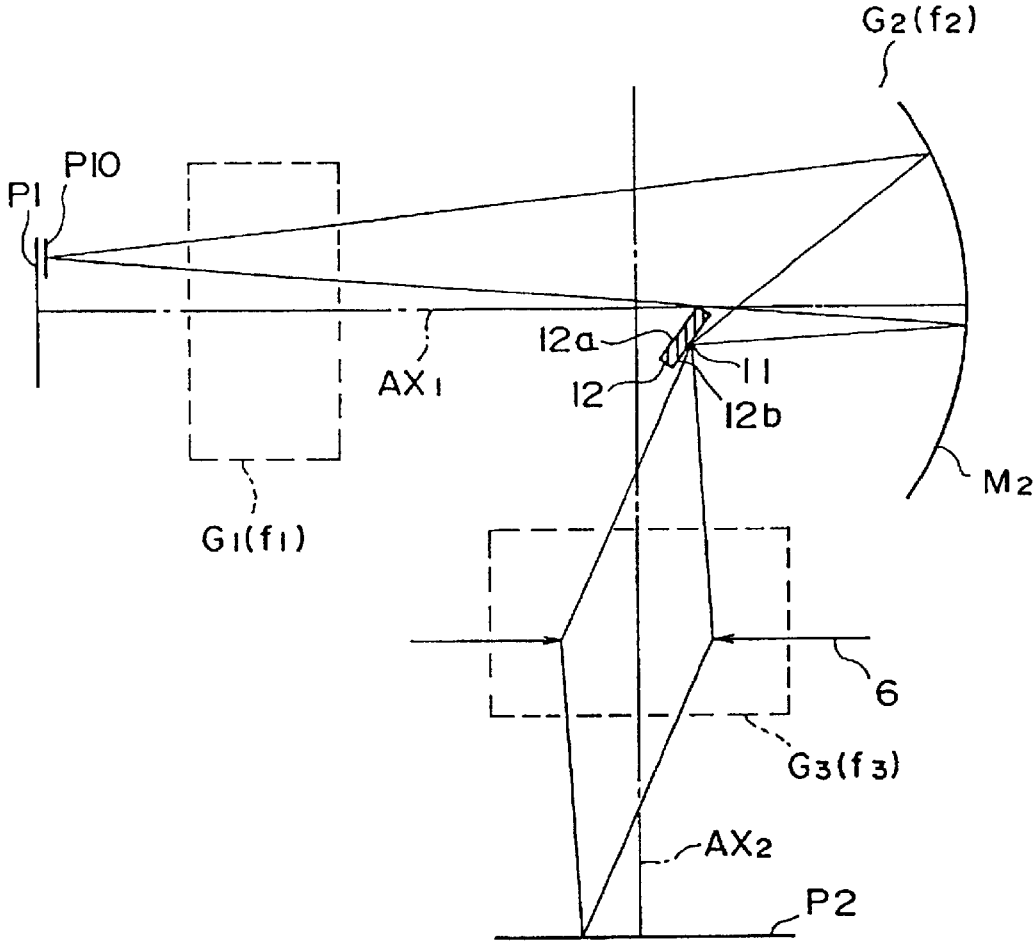
FIG. 17 is a structural drawing to show the basic structure of the projection optical system in the third embodiment.

The third embodiment is a projection optical system with a magnification of ¼×, suitably applicable to the projection exposure apparatus of the scanning exposure method. This third embodiment is an embodiment of the optical system using a partial mirror as well. As shown in FIG. 17, the partial mirror 12 is provided between the first converging group G, and the second converging group $G_2$, and positioned so as to avoid being disposed on the optical axes AX1, AX2 of the first converging group $G_1$ and the third converging group $G_3$. The partial mirror 12 has a first reflective surface 12a arranged obliquely to the optical axis AX1 of the first converging group $G_1$ ana a second reflective surface 12b opposite to the first reflective surface 12a.

Figure 18:
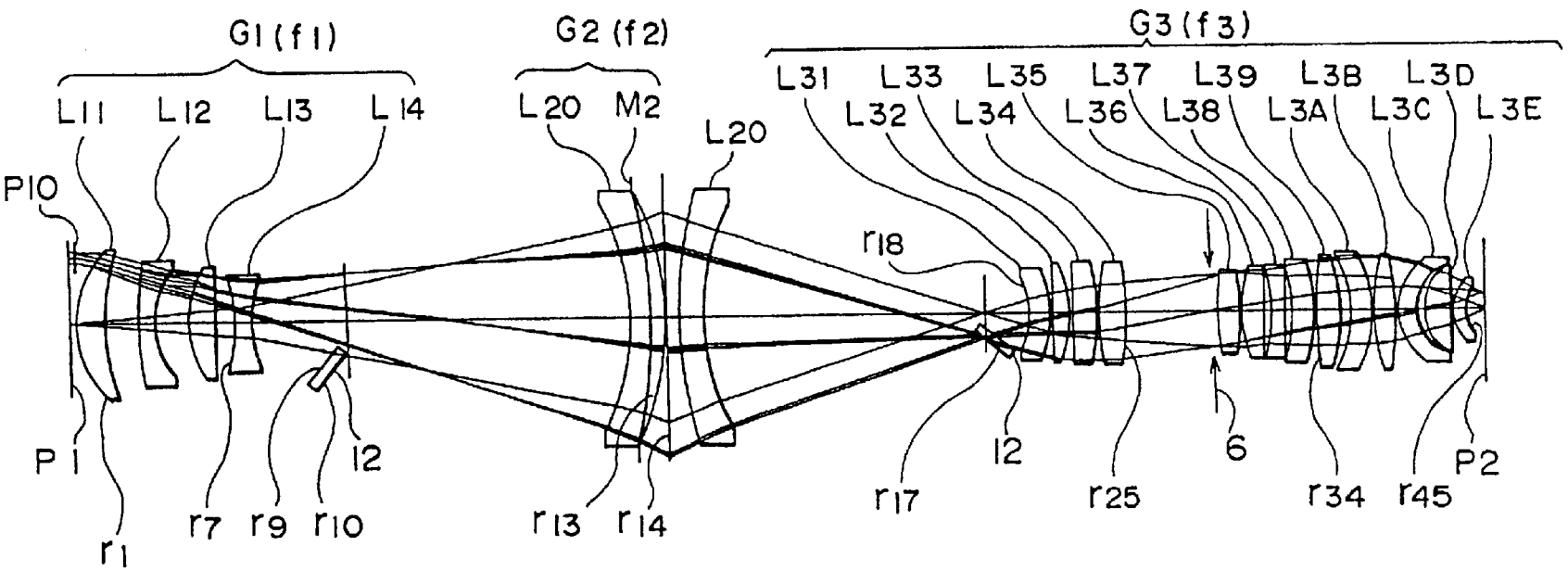
FIG. 18 is an optical path development of the projection optical system in the third embodiment.
Figure 19:
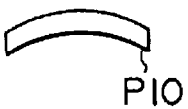

FIG. 18 is an optical path development of the projection optical system of the third embodiment, and FIG. 19 shows an illumination region P10 on the reticle R. As shown in this FIG. 19, an arcuate illumination area P10 on the reticle R is illuminated by an illumination optical system. Then, in FIG. 18, light from patterns in the illumination area P10 on the reticle R travels through a first converging group $G_1$ consisting of four refractive lenses and then passes beside the partial mirror 12. In other words, the first reflective surface 12a of the partial mirror 12 separates a part of the light from the first converging group $G_1$.

This passing light reaches a second converging group $G_2$ consisting of a negative meniscus lens $L_{20}$ and a concave, reflective mirror $M_2$, and light reflected by the second converging group $G_2$ forms an intermediate image 11 of the patterns in the illumination area P10, near the partial mirror 12 (see FIG. 17). Then light from the intermediate image 11 is reflected by a second reflective surface 12b of the partial mirror 12 and thereafter passes through a third converging group $G_3$ consisting of fourteen refractive lenses to form a second intermediate image of the patterns on the surface of wafer W. Also, an aperture stop 6 is placed on a Fourier transform plane in the third converging group $G_3$, i.e., between a convex lens $L_{34}$ and a convex lens $L_{35}$ *near a last one of the beam waists*. In this case, letting β be a projection magnification of from reticle R to wafer W, the reticle area R is scanned upward at a predetermined velocity $V_R$ and in synchronization therewith the wafer 11 is scanned upward at a velocity $\beta \cdot V_R$, thus performing exposure in the scanning exposure method.

Also, as shown in FIG. 18, the first converging group $G_1$ is composed of, in the order from the reticle R side, a positive meniscus lens $L_{14}$ with a convex surface to the reticle R, a negative meniscus lens $L_{12}$ with a convex surface to the reticle R, a convex lens $L_{13}$ and a concave lens $L_{14}$, and the second converging group $G_2$ is composed of a negative meniscus lens $L_{20}$ with a concave surface to the reticle R, and a concave, reflective mirror $M_2$. Further, the third converging group $G_3$ is composed of a negative meniscus lens $L_{31}$ with a concave surface to the reticle R, a positive meniscus lens $L_{32}$, with a concave surface to the reticle R, a positive meniscus lens $L_{33}$ with a concave surface to the reticle R, a convex lens $L_{34}$, a convex lens $L_{35}$, a positive meniscus lens $L_{36}$ with a convex surface to the reticle R, a concave lens $L_{37}$, a positive meniscus lens $L_{38}$ with a concave surface to the reticle R, a convex lens $L_{39}$ a negative meniscus lens $L_{3A}$ with a concave surface to the reticle R, a convex lens $L_{3B}$, a negative meniscus lens $L_{3C}$ with a convex surface to the reticle R, a positive meniscus lens $L_{3D}$ with a convex surface to the reticle R, and a negative meniscus lens $L_{3E}$ with a convex surface to the reticle R.

A magnification of the total system is ¼×(demagnification), a numerical aperture NA on the wafer 11 side (image side) is 0.4, and the object height is 26 mm. The optical system may be used in the one-shot exposure method.

The refractive lenses all are made of a kind of optical glass of fused quartz, which are corrected for axial and lateral chromatic aberrations for a wavelength band of 1 nm at the wavelength of 193 nm of the ultraviolet excimer laser light. Also, the optical system has excellent image-forming performance, as well corrected for spherical aberration, coma, astigmatism, and distortion up to a nearly zero aberration state, and the good image-forming performance can be retained even if the optical system is proportionally enlarged two to three times.

Next Table 3 shows radii of curvature $r_i$, surface separations $d_i$ and glass materials in the third embodiment of FIGS. 17 and 18. In the following table, the fourteenth surface is a virtual plane for indicating the concave, reflective mirror in the optical path development.

TABLE 3

| i | $r_i$ | $d_i$ | Glass Material |
|---|---|---|---|
| 0 | 0 | 2.2 | |
| 1 | 38.17 | 10.0 | $S_iO_2$ |
| 2 | 76.72 | 12.0 | |
| 3 | 142.94 | 6.0 | $S_iO_2$ |
| 4 | 32.99 | 11.7 | |
| 5 | 36.73 | 10.0 | $S_iO_2$ |
| 6 | −337.52 | 6.5 | |
| 7 | −51.05 | 6.0 | $S_iO_2$ |
| 8 | 46.99 | 34.6 | |
| 9 | ∞ | 30.3 | |
| 10 | ∞ | 69.6 | |
| 11 | −87.27 | 8.0 | $S_iO_2$ |
| 12 | −177.44 | 4.8 | |
| 13 | −101.17 | 0.0 | |
| 14 | ∞ | 4.8 | |
| 15 | 177.44 | 8.0 | $S_iO_2$ |
| 16 | 87.27 | 100.0 | |
| 17 | ∞ | 14.6 | |
| 18 | −36.36 | 8.0 | $S_iO_2$ |
| 19 | −40.19 | 1.0 | |
| 20 | −579.38 | 6.0 | $S_iO_2$ |
| 21 | −39.93 | 1.0 | |
| 22 | −280.59 | 8.0 | $S_iO_2$ |
| 23 | −108.42 | 1.0 | |
| 24 | 140.91 | 9.4 | $S_iO_2$ |
| 25 | −191.84 | 32.9 | |
| 26 | 92.51 | 8.0 | $S_iO_2$ |
| 27 | −154.05 | 1.0 | |
| 28 | 58.31 | 7.0 | $S_iO_2$ |
| 29 | 427.83 | 4.0 | |
| 30 | −43.79 | 4.0 | $S_iO_2$ |
| 31 | 1615.36 | 3.0 | |
| 32 | −48.72 | 8.2 | $S_iO_2$ |
| 33 | −43.49 | 0.3 | |
| 34 | 165.95 | 8.2 | $S_iO_2$ |
| 35 | −82.87 | 3.7 | |
| 36 | −43.10 | 6.7 | $S_iO_2$ |
| 37 | −50.06 | 1.0 | |
| 38 | 75.15 | 7.0 | $S_iO_2$ |
| 39 | −168.78 | 1.0 | |
| 40 | 21.81 | 7.0 | $S_iO_2$ |
| 41 | 17.17 | 3.0 | |
| 42 | 21.02 | 8.0 | $S_iO_2$ |
| 43 | 97.85 | 1.0 | |
| 44 | 17.80 | 3.7 | $S_iO_2$ |
| 45 | 13.10 | 6.9 | |

Also, FIGS. 20 to 22 show longitudinal aberration diagrams of the third embodiment, FIG. 23 shows a lateral chromatic aberration diagram of the third embodiment, and FIG. 24 shows transverse aberration diagrams of the third embodiment. In particular, FIG. 20 shows spherical aberration of the third embodiment, FIG. 21 shows astigmatism of the third embodiment, and FIG. 22 shows distortion of the third embodiment. It is seen from these aberration diagrams that although the numerical aperture is large as 0.4 in this example, the aberrations are well corrected in a wide image circle region. Further, chromatic aberration is well corrected as well.

Fourth Embodiment

Figure 25:
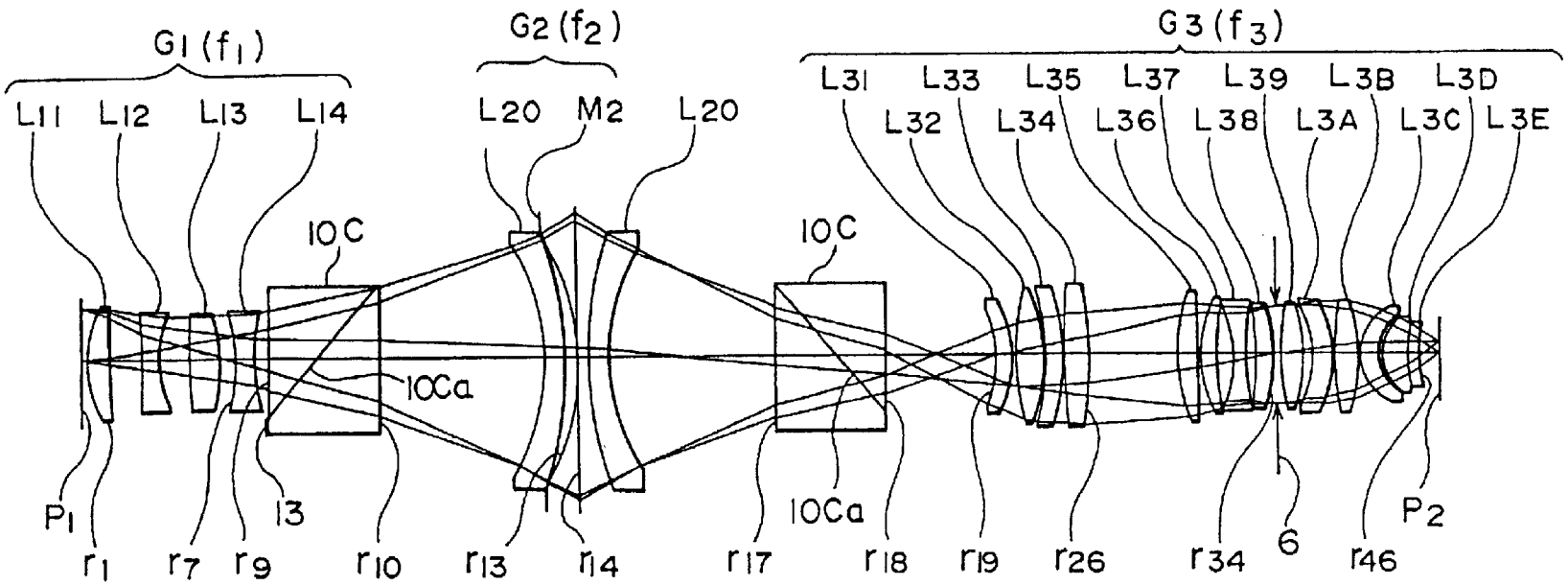
FIG. 25 is an optical path development of the projection optical system in the fourth embodiment.

The fourth embodiment is a projection optical system with a magnification of ¼×, suitably applicable to the projection exposure apparatus of the one-shot exposure method (steppers etc.). This fourth embodiment is an embodiment as a modification of the optical system of FIG. 2 as well. FIG. 25 is an optical path development of the projection optical system of the fourth embodiment. As shown in FIG. 25, light from patterns on the reticle R travels through a first converging group $G_1$ consisting of four refractive lenses and then enters a beam splitter surface 10Ca in a polarizing beam splitter 10C of a rectangular parallelpiped. The polarizing beam splitter 10C in the present embodiment is of a rectangular parallelepiped, and an incident surface ($r_9$) of the illumination light is wider by a region 13 than a projection image of the beam splitter surface 10Ca. This permits the polarizing beam splitter 10C in FIG. 25 to be constructed thinner than the polarizing beam splitter 10A in FIG. 4.

A light beam having passed through the beam splitter surface 10Ca passes through a quarter wave plate 9 (not shown in FIG. 25) to reach a second converging group $G_2$ consisting of a negative meniscus lens $L_{20}$ and a concave, reflective mirror $M_2$, and light reflected by the second converging group $G_2$ travels through the quarter wave plate 9 (not shown FIG. 25), then is reflected by the beam splitter surface 10Ca in the polarizing beam splitter 10C, and forms an intermediate image 11 of the patterns at a position in the vicinity of the polarizing beam splitter 10C.

Then a light beam from the intermediate image 11 passes through a third converging group $G_3$ consisting of fourteen refractive lenses to form a second intermediate image of the patterns on the surface of wafer W. In this case, an aperture stop 6 is placed on a Fourier transform plane in the third converging group $G_3$ that is, between a positive meniscus lens $L_{38}$ and a convex lens $L_{39}$.

Also, as shown in FIG. 25, the first converging group $G_1$ s composed of, in the order from the reticle R side, a positive meniscus lens $L_{11}$ with a convex surface to the reticle R, a concave lens $L_{14}$, a convex lens $L_{13}$, a concave lens $L_{14}$, and the second converging group $G_2$ is composed of a negative meniscus lens $L_{20}$ with a concave surface to the reticle R, and a concave, reflective mirror $M_2$. Further, the third converging group $G_3$ is composed of a positive meniscus lens $L_{31}$ with a concave surface to the reticle R, a convex lens $L_{32}$, a negative meniscus lens $L_{33}$, with a concave surface to the reticle R, a convex lens $L_{34}$, a convex lens $L_{35}$, a positive meniscus lens $L_{36}$ with a convex surface to the reticle R, a concave lens $L_{37}$, a positive meniscus lens $L_{38}$ with a concave surface to the reticle R, a convex lens $L_{39}$, a negative meniscus lens $L_{3A}$ with a concave surface to the reticle R, a convex lens $L_{3B}$, a negative meniscus lens $L_{3C}$ with a convex surface to the reticle R, a positive meniscus lens $L_{3D}$ with a convex surface to the reticle R, and a negative meniscus lens $L_{3E}$ with a convex surface to the reticle R.

A magnification of the total system is ¼×(demagnification), a numerical aperture NA on the wafer 11 side (image side) is 0.6, and the object height is 20 mm.

The refractive lenses all are made of a kind of optical glass of fused quartz, which are corrected for axial and lateral chromatic aberrations for a wavelength band of 1 nm at the wavelength of 193 nm of the ultraviolet excimer laser light. Also, the optical system has excellent image-forming performance, as well corrected for spherical aberration, coma, astigmatism, and distortion up to a nearly zero aberration state, and the good image-forming performance can be retained even if the optical system of FIG. 25 is proportionally enlarged two to three times.

Next Table 4 shows radii of curvature $r_i$, surface separations di and glass materials in the fourth embodiment of FIG. 25. In the following table, the fourteenth surface is a virtual plane for indicating the concave, reflective mirror in the optical path development.

TABLE 4

| i | $r_i$ | $d_i$ | Glass Material |
|---|---|---|---|
| 0 | 0 | 2.2 | |
| 1 | 43.62 | 8.0 | $S_iO_2$ |
| 2 | −319.17 | 12.6 | |
| 3 | −250.41 | 6.0 | $S_iO_2$ |
| 4 | 42.75 | 11.7 | |
| 5 | 1371.37 | 10.0 | $S_iO_2$ |
| 6 | −83.00 | 7.3 | |
| 7 | 46.47 | 6.0 | $S_iO_2$ |
| 8 | 73.09 | 5.0 | |
| 9 | ∞ | 40.0 | $S_iO_2$ |
| 10 | ∞ | 60.7 | |
| 11 | −78.96 | 7.2 | $S_iO_2$ |
| 12 | −145.84 | 4.3 | |
| 13 | −92.70 | 0.0 | |
| 14 | ∞ | 4.3 | |
| 15 | 145.84 | 7.2 | $S_iO_2$ |
| 16 | 78.96 | 60.7 | |
| 17 | ∞ | 40.0 | $S_iO_2$ |
| 18 | ∞ | 40.0 | |
| 19 | −48.19 | 6.0 | $S_iO_2$ |
| 20 | −39.43 | 1.0 | |
| 21 | 99.65 | 10.0 | $S_iO_2$ |
| 22 | 69.37 | 1.0 | |
| 23 | −82.13 | 6.0 | $S_iO_2$ |
| 24 | −95.92 | 1.0 | |
| 25 | 426.51 | 8.4 | $S_iO_2$ |
| 26 | −155.92 | 32.9 | |
| 27 | 65.87 | 7.0 | $S_iO_2$ |
| 28 | −861.00 | 1.0 | |
| 29 | 45.43 | 6.0 | $S_iO_2$ |
| 30 | 144.51 | 6.0 | |
| 31 | −47.72 | 3.6 | $S_iO_2$ |
| 32 | 9.88 | 4.3 | |
| 33 | −139.82 | 6.2 | $S_iO_2$ |
| 34 | −63.75 | 3.3 | |
| 35 | 164.20 | 7.2 | $S_iO_2$ |
| 36 | −61.66 | 3.7 | |
| 37 | −35.40 | 6.7 | $S_iO_2$ |
| 38 | −42.77 | 1.0 | |
| 39 | 194.25 | 8.0 | $S_iO_2$ |
| 40 | −64.00 | 1.0 | |
| 41 | 21.24 | 5.7 | $S_iO_2$ |
| 42 | 16.45 | 1.5 | |
| 43 | 17.66 | 9.0 | $S_iO_2$ |
| 44 | 103.14 | 0.5 | |
| 45 | 60.80 | 3.7 | $S_iO_2$ |
| 46 | 40.36 | 7.0 | |

Figures 26, 27, 28, 29, 30:
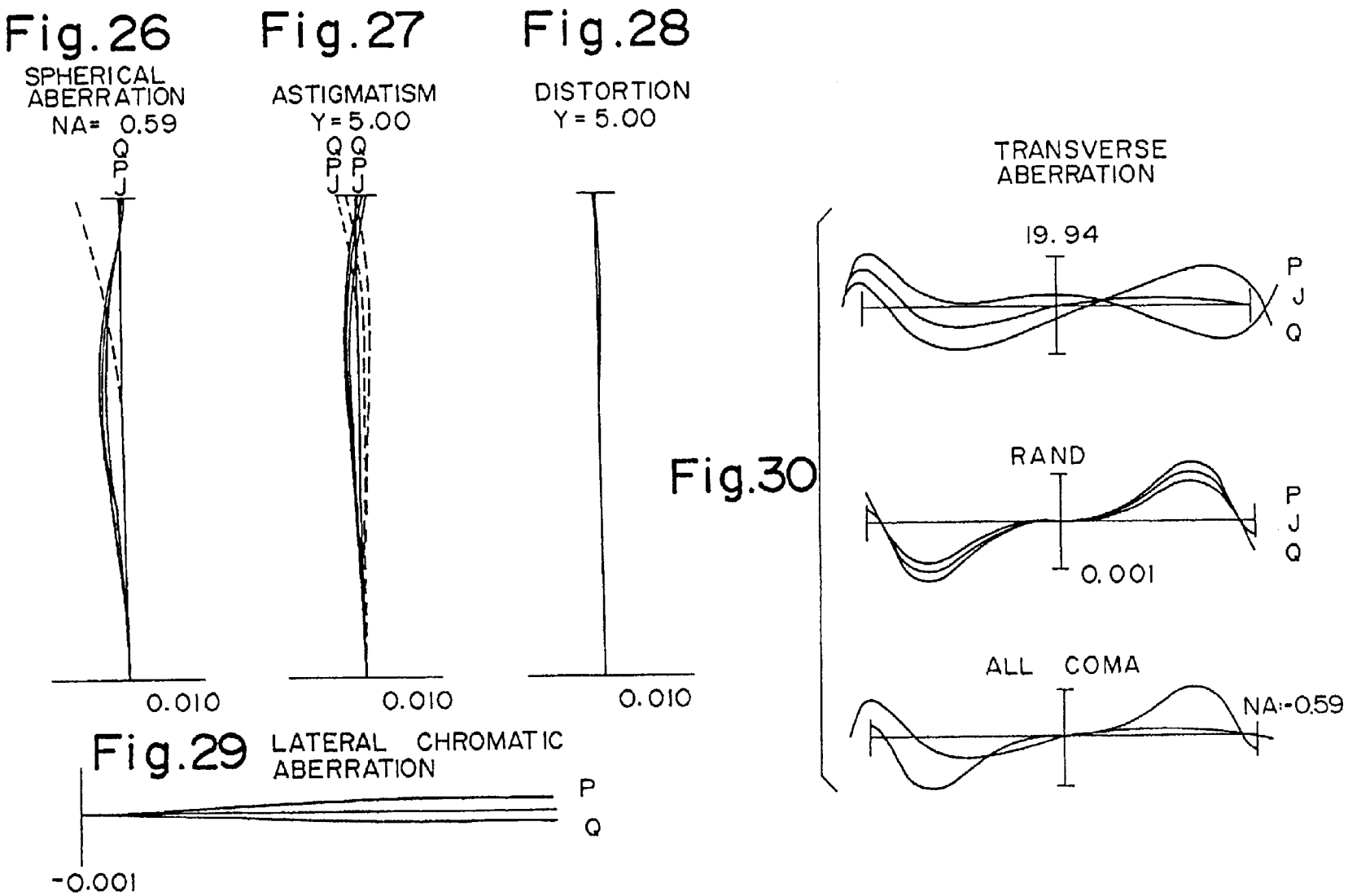
FIGS. 26 to 30 are aberration diagrams of the fourth embodiment.

Also, FIGS. 26 to 28 show longitudinal aberration diagrams of the fourth embodiment, FIG. 29 shows a lateral chromatic aberration diagram of the fourth embodiment, and FIG. 30 shows transverse aberration diagrams of the fourth embodiment. In particular, FIG. 26 shows spherical aberration of the fourth embodiment, FIG. 27 shows astigmatism of the fourth embodiment, and FIG. 28 shows distortion of the fourth embodiment. It is seen from these aberration diagrams that although the numerical aperture is large as 0.6 in this example, the aberrations are well corrected in a wide image circle region. Further, chromatic aberration is well corrected as well.

It is preferred that the conditions of equations (1) to (6) be satisfied in the present invention, and thus, correspondence is next described between each embodiment as described above and the conditions of equations. First, Table 5 to Table 8 each show the radius of curvature r of the concave, reflective mirror $M_2$, focal lengths $f_i$ of the i-th converging groups $G_i$ (i=1 to 3), Petzval sums $p_i$, apparent refractive indices $n_i$, image magnifications $\beta_i$, a magnification $\beta_{12}$ of a combinational system of the first converging group $G_1$ with the second converging group $G_2$, an image magnification $\beta_3$ of the third converging group $G_3$, a Petzval sum p of the total system, and a magnification β of the total system in each embodiment as described above. Here, the total system is represented by $G_T$, and blocks for Petzval sum $p_i$ and image magnification $\beta_i$ corresponding to the total system $G_T$ indicate the Petzval sum and image magnification of the total system, respectively.

TABLE 5

Specifications of first embodiment

| | r | $f_i$ | $p_i$ | $n_i$ | $\beta_i$ | $\beta_{ij}$ |
|---|---|---|---|---|---|---|
| $G_1$ | — | −197.278 | −0.00887 | 0.60199 | 0.47913 | −0.32802 |
| $G_2$ | −89.277 | 56.4187 | 0.02674 | −0.66285 | −0.68461 | |
| $G_3$ | — | −303.1767 | 0.03546 | −0.09302 | −0.76215 | −0.76215 |
| $G_T$ | — | — | −0.00015 | — | 0.25004 | 0.25004 |

TABLE 6

Specifications of second embodiment

| | r | $f_i$ | $p_i$ | $n_i$ | $\beta_i$ | $\beta_{ij}$ |
|---|---|---|---|---|---|---|
| $G_1$ | — | −236.848 | −0.00836 | 0.505038 | 0.4993 | −0.33286 |
| $G_2$ | −92.707 | 58.5864 | −0.02575 | 0.662866 | −0.66665 | |
| $G_3$ | — | −206.081 | 0.03442 | −0.140978 | −0.750195 | −0.750195 |
| $G_T$ | — | — | 0.00032 | — | 0.20 | 0.24971 |

TABLE 7

Specifications of third embodiment

| | r | $f_i$ | $p_i$ | $n_i$ | $\beta_i$ | $\beta_{ij}$ |
|---|---|---|---|---|---|---|
| $G_1$ | — | −313.155 | −0.00749 | 0.426342 | 0.53714 | −0.33331 |
| $G_2$ | −101.175 | 66.2825 | −0.02395 | −0.629935 | −0.620527 | |
| $G_3$ | — | −696.956 | 0.03173 | −0.045219 | −0.75104 | −0.75104 |
| $G_T$ | — | — | 0.00029 | — | 0.25033 | 0.25033 |

TABLE 8

Specifications of fourth embodiment

| | r | $f_i$ | $p_i$ | $n_i$ | $\beta_i$ | $\beta_{ij}$ |
|---|---|---|---|---|---|---|
| $G_1$ | — | −105.504 | −0.01079 | 0.87843 | 0.46888 | −0.39211 |
| $G_2$ | −92.7068 | 58.586 | 0.02575 | −0.66287 | −0.83627 | |
| $G_3$ | — | −107.983 | 0.03733 | −0.24808 | −0.63959 | −0.63959 |
| $G_T$ | — | — | 0.00079 | — | 0.25079 | 0.25079 |

Further, based on Table 5 to Table 8, values are calculated for $(p_1+p_3)$, $p_2$, $|p_1+p_2+p_3|$, $|\beta_{12}|$, $|\beta_3|$, and $|\beta|$ in each embodiment, and the following Table 9 shows the calculated values.

TABLE 9

Table of correspondence conditions

| Conditions\ Embodiment | 1 | 2 | 3 | 4 |
|---|---|---|---|---|
| (1) $p_1 + p_3 > 0$ | 0.02659 | 0.02606 | 0.02424 | 0.02654 |
| (2) $p_2 < 0$ | −0.02674 | −0.02575 | −0.02395 | −0.02575 |
| (3) $\lvert p_1 + p_2 + p_3 \rvert < 0.1$ | 0.00015 | 0.00031 | 0.00029 | 0.00079 |
| (4) $0.1 \leqq \lvert\beta_{12}\rvert \leqq 0.5$ | 0.32802 | 0.33286 | 0.33331 | 0.39211 |
| (5) $0.25 \leqq \lvert\beta_3\rvert \leqq 2$ | 0.76215 | 0.7502195 | 0.75104 | 0.63959 |
| (6) $0.1 \leqq \lvert\beta\rvert \leqq 0.5$ | 0.25004 | 0.24971 | 0.25033 | 0.25079 |

From this table, it is seen that either one of the above-described embodiments satisfies the conditions of equations (1) to (6).

The embodiments as described above employed quartz as a glass material for forming the refractive optical system, but another optical glass such as fluorite may be used.

Figure 31:
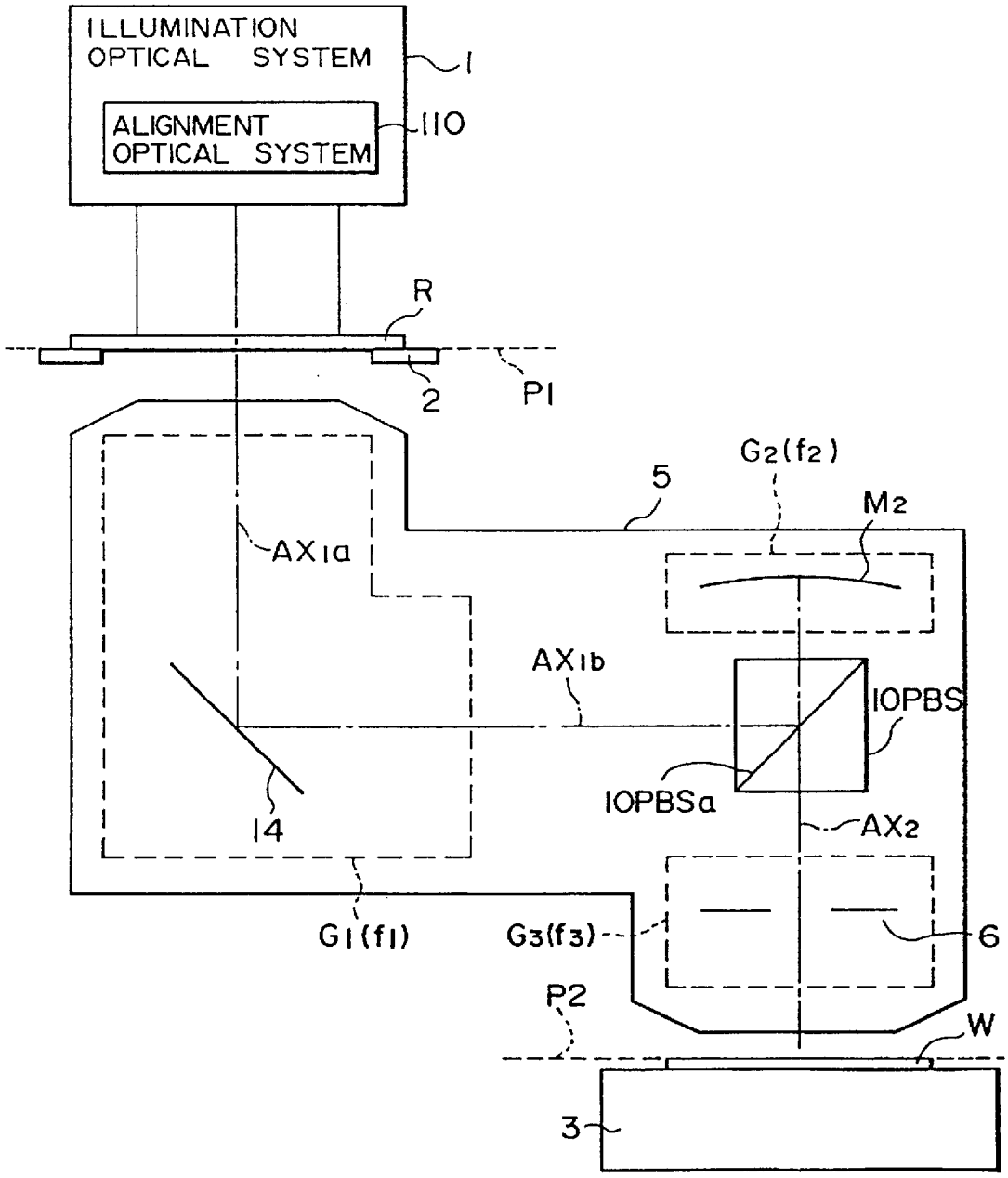
FIG. 31 is a structural drawing to show a structure of the catadioptric projection optical system applied to a common exposure apparatus.

Next, an embodiment of a common exposure apparatus using the catadioptric projection optical system 5 of the present invention. In this embodiment, as shown in FIG. 31, the first converging group $G_1$ includes a reflector 14 changing a traveling direction of light that travels in the first converging group $G_1$. Therefore, the optical axis AX1 of the first converting group $G_1$ is constituted by optical axes AX1a and AX1b as shown in FIG. 31. The techniques relating to an exposure apparatus using a catadioptric projection optical system is described, for example, in Japanese Laid-Open Patent application Ser. No. 5-72478, or the like.

Thus, the present invention is by no means limited to the above-described embodiments, but may employ a variety of constitutions within a range not departing from the essence of the present invention.

Figure 2:
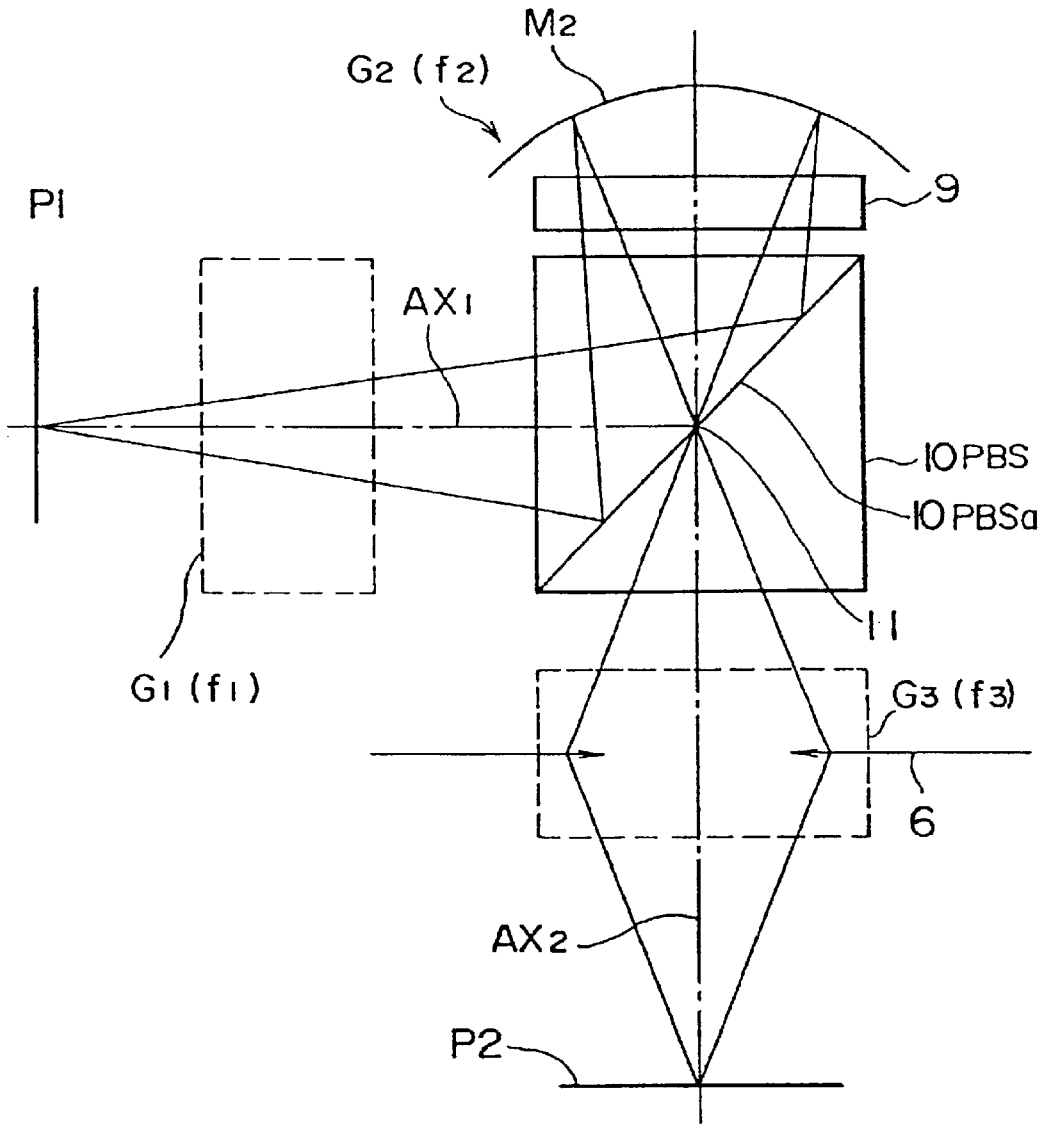
FIG. 2 is a structural drawing to show the basic structure of the catadioptric projection optical system 5 in FIG. 1.
Figure 3:
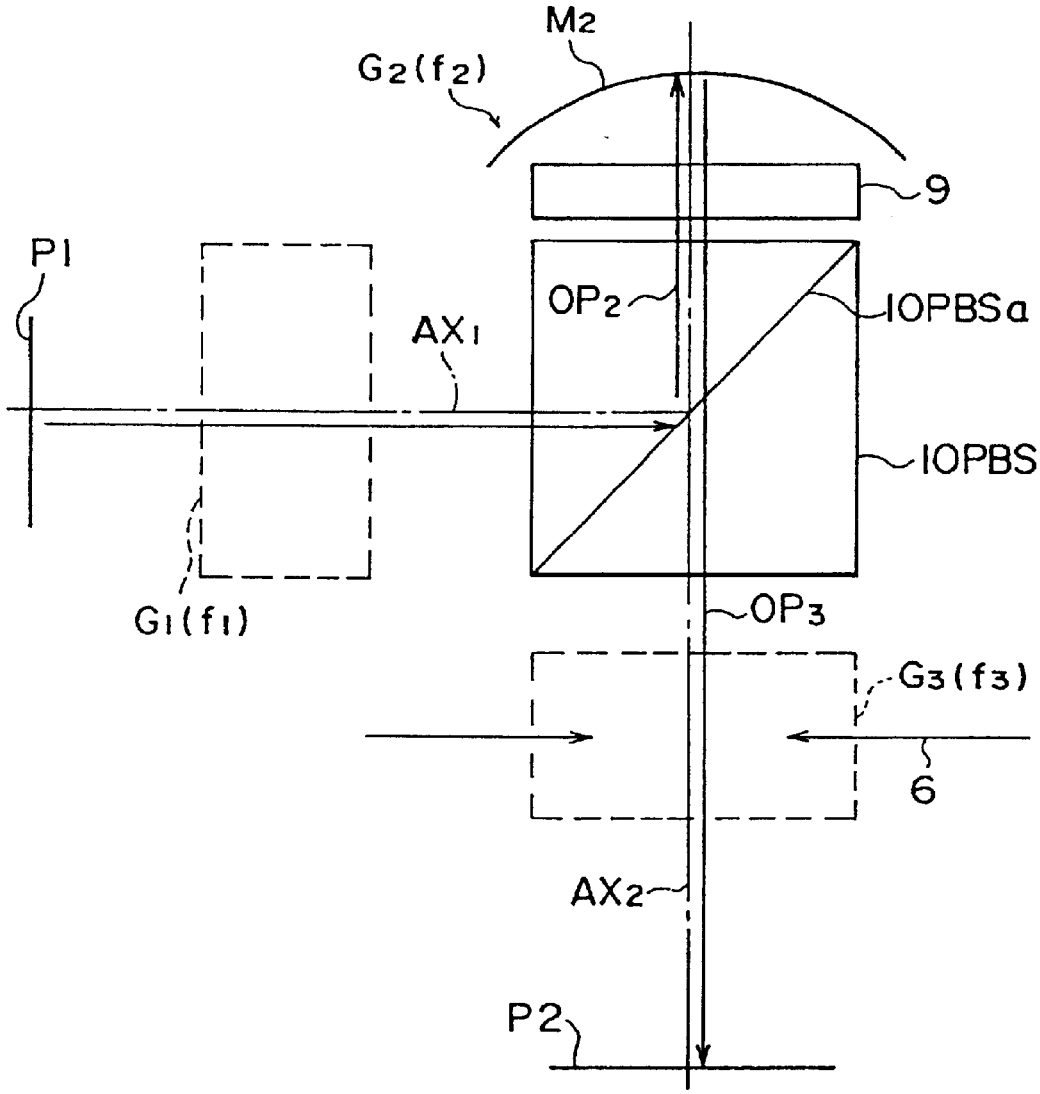
FIG. 3 is an illustration of optical paths of a light beam traveling in the catadioptric projection optical system in FIG. 2.

Since the catadioptric projection optical system of FIG. 2 is so arranged that the image once formed between the concave, reflective mirror and the second plane (image plane), there are advantages that a compact prism type beam splitter can be used and that an optical path between the concave, reflective mirror and the image plane can be set long. Accordingly, deterioration may be reduced for image-forming characteristics due to nonuniformity of characteristics in the semitransparent surface of beam splitter, and the working distance can be extended. In other words, the catadioptric projection optical system can secure a sufficiently long optical Data to the wafer (image plane P2), of the illumination light reflected by the concave, reflective mirror $M_2$, because an intermediate image is formed between the mirror $M_2$ and the second image-forming optical system $G_3$. Therefore, a number of refractive lenses can be arranged in the optical path to achieve satisfactory image-forming performance. This also caused an effect that a distance between a wafer-side end face of refractive lens and the wafer, which is the working distance, was long enough.

Also, different from the ring field optical system for projecting only an annular part using an off-axis light beam, the optical system of the invention includes an advantage that it can employ the one-shot exposure method under a high numerical aperture.

Since an aperture stop can be placed in the second image-forming optical system, the optical system of the invention can enjoy an advantage that the σ value being a coherence factor can be freely controlled.

In the case of the conventional catadioptric systems, adjustment was difficult because of eccentricity of optical axis, and thus, image-forming performance as designed was rarely able to be achieved. In contrast, the catadioptric projection optical system according to the present invention permits independent adjustment of the first image-forming optical system and the second image-forming optical system, and after the adjustment the two image-forming optical systems may be set with the optical axis approximately vertical, which facilitates adjustment of eccentricity etc.

Since the image magnification by the first image-forming optical system can be freely selected, an excellent optical performance state can be realized.

In this case, an advantage of a further size reduction of the beam splitter can be attained by forming the intermediate image inside the prism type beam splitter.

Next, because the second catadioptric projection optical system of FIG. 17 is so arranged that the image is once formed between the concave, reflective mirror and the second plane (image plane), there are advantages that a compact partial mirror can be used and that the optical path between the concave, reflective mirror and the image plane can be set long.

Further, when the partial mirror is used, the best image region is, for example, arcuate or slit as eccentric from the optical axis. Such an image region is suitable for the projection exposure apparatus of the scanning exposure method.

Next, when the conditions of equations (1) to (3) are satisfied, the Petzval sum of the total optical system readily becomes nearly 0, so that the projection image surface becomes approximately flat. Further, when the conditions of equations (4) and (5) are satisfied, a magnification balance becomes reasonable, and the optical system can be easily constructed.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims. The basic Japanese application No. 6-90837 filed on Apr. 28, 1994 is hereby incorporated by reference.

What is claimed is:

1. A catadioptric optical system, for forming an image of a first object onto a second object, comprising:

a first image-forming optical system having a first group with positive refractive power and a second group including a concave mirror;

a second image-forming optical system, arranged on an optical path between a mirror and the second object, having at least a refractive lens element, wherein said second image-forming optical system is a dioptric optical system; and the mirror arranged in one of spaces respectively by a virtual plane, said virtual plane including one of an optical axis of said first image-forming optical system and an optical axis of said second image-forming optical system, said spaces positioned between said first group and said second group.

2. A system according to claim 1, wherein an intermediate image of the first object is formed on an optical path between said first-image forming optical system and said second-image forming optical system.

3. A system according to claim 2, wherein the intermediate image is formed in the space in which said partial mirror is arranged.

4. A system according to claim 1, wherein the light from said first group reaches said second group without passing through said partial mirror.

5. A system according to claim 4, wherein an intermediate image of the first object is formed in the space in which said partial mirror is arranged an on an optical path between said first-image forming optical system and said second-image forming optical system.

6. A system according to claim 1, wherein said partial mirror is arranged so as to be oblique to the optical axis of said first image-forming optical system.

7. An exposure apparatus comprising:

an illuminating optical system having a light source;

a catadioptric optical system according to claim 1; and a stage, arranged on an optical path between said illuminating optical system and said catadioptric optical system, for supporting a mask as a first object;

8. An apparatus according to claim 7, wherein said illuminating optical system forms illumination area spreaded unidirectionally, onto the mask.

9. A fabricating method comprising:

preparing a mask with a predetermined pattern;

illuminating the mask with exposure light having a predetermined wavelength; and projecting a secondary image of said pattern onto a photosensitive substrate through a catadioptric optical system according to claim 1.

10. A catadioptric optical system, for forming an image of a first object onto a second object, comprising:

a first image-forming optical system having a first group including at least a lens element and a second group including a concave mirror;

a second image-forming optical system, arranged on an optical path between a mirror and the second object, having at least a refractive lens element;

said mirror arranged in one side of multiple spaces separated by a virtual plane, said virtual plane including one of an optical axis of said first image-forming optical system and an optical axis of said second image-forming optical system, and arranged between said lens element of the first group and said second group; and wherein an intermediate image of the first object is formed in the space in which said mirror is arranged and on an optical path between said first image-forming optical system and said second image-forming optical system, and wherein said second image-forming optical system is a dioptric optical system.

11. A system according to claim 10, wherein the light from said first group reaches said second group without passing through said partial mirror.

12. A system according to claim 10, wherein said partial mirror is arranged so as to be oblique to the optical axis of said first image-forming optical system.

13. A system according to claim 10, wherein said first group of said first image-forming optical system has refractive power.

14. A system according to claim 10, wherein the following conditions are satisfied:

$$0.1 \leqq |\beta_{12}| \leqq 0.5,$$

$$0.25 \leqq |\beta_3| \leqq 2,$$

and $$[0.1 \leqq |\beta| \leqq 0.5]\ \mathit{0.1} \leqq |\beta| \leqq \mathit{0.5}$$

wherein $\beta_{12}$ is a magnification of from the first object to the intermediate image, $\beta_3$ is a magnification of from the intermediate image to the image on the second object, and $\beta$ is a magnification of from the first object to the second object.

15. An exposure apparatus comprising:

an illuminating optical system having a light source;

a catadioptric optical system according to claim 10; and a stage, arranged on an optical path between said illuminating optical system and said catadioptric optical system, for supporting a mask as the first object.

16. An apparatus according to claim 15, wherein said illuminating optical system forms illumination area spreaded unidirectionally, onto the mask.

17. A fabricating method comprising:

preparing a mask with a predetermined pattern;

illuminating the mask with exposure light having a predetermined wavelength; and projecting a secondary image of the pattern onto a photosensitive substrate through a catadioptric optical system according to claim 10.

18. A catadioptric optical system for forming a reduced image of a first object onto a second object, comprising:

a catadioptric optical sub-system having a first reduction magnification;

a dioptric optical sub-system, arranged in an optical path between said catadioptric optical sub-system and said second object, having a second reduction magnification;

wherein an intermediate image of said first object is formed on an optical path between said catadioptric optical sub-system and said dioptric optical sub-system; and wherein said dioptric optical sub-system forms an image of said intermediate image on the second object.

19. A catadioptric optical system according to claim 18, wherein said dioptric optical sub-system includes an aperture stop.

20. A catadioptric optical system according to claim 19, wherein said aperture stop is capable of controlling a coherence factor.

21. A catadioptric optical system according to claim 18, wherein said catadioptric optical sub-system includes a concave mirror, and wherein a principal ray crosses an optical axis of the catadioptric optical sub-system at a position between said concave mirror and the first object.

22. A catadioptric optical system according to claim 18, wherein said catadioptric optical sub-system and said dioptric optical sub-system are constructed independently of each other.

23. A catadioptric optical system according to claim 22, wherein an optical axis of said catadioptric optical sub-system and an optical axis of said dioptric optical sub-system cross vertically.

24. A catadioptric optical system according to claim 18, further comprising a reflective mirror at an optical path between said catadioptric optical sub-system and said dioptric optical sub-system.

25. An exposure method comprising:

preparing a mask with a predetermined pattern at a first surface;

illuminating the mask with exposure light having a predetermined wavelength; and projecting a secondary image of the pattern of the mask onto a photosensitive substrate, arranged at a second surface, through the catadioptric optical system of claim 18.

26. An exposure method according to claim 25, further comprising the step wherein said mask and said photosensitive substrate move in synchronization.

27. An exposure method according to claim 26, wherein a best image region of the catadioptric optical system is a slit eccentric from an optical axis of the catadioptric optical system.

28. An exposure apparatus, comprising:

an illumination optical system having a light source;

a first stage, capable of holding a mask, adjacent said illumination optical system;

a catadioptric optical system of claim 18 arranged adjacent said first stage; and a second stage, arranged adjacent said catadioptric optical system opposite said first stage, and capable of holding a photosensitive substrate.

29. A catadioptric optical system for forming a reduced image of a first object onto a second object, comprising:

a catadioptric optical sub-system having a first reduction magnification;

a dioptric optical sub-system, arranged in an optical path between said catadioptric optical sub-system and said second object, having an aperture stop and a second reduction magnification;

wherein an intermediate image of said first object is formed on an optical path between said catadioptric optical sub-system and said dioptric optical sub-system;

wherein a secondary image of said first object is formed on the second object; and wherein said aperture stop is capable of controlling a coherence factor.

30. An exposure method comprising:

preparing a mask with a predetermined pattern at a first surface;

illuminating the mask with exposure light having a predetermined wavelength;

projecting a secondary image of the pattern of the mask onto a photosensitive substrate, arranged at a second surface, through the catadioptric optical system of claim 29.

31. An exposure apparatus, for exposing a pattern of a mask onto a photosensitive substrate, comprising:

an illumination optical system having a light source;

a first stage, capable of holding the mask, adjacent said illumination optical system;

a catadioptric optical system of claim 29 arranged adjacent said first stage; and a second stage, arranged adjacent said catadioptric optical system opposite the first stage, and capable of holding the photosensitive substrate.

*32. A catadioptric imaging optical system used in a projection optical system that transfers a pattern on a mask onto a substrate, comprising:*

*from the mask to an intermediate image, a catadioptric imaging optical sub-system arranged in an optical path between the mask and the substrate;*

*from the intermediate image to a second image, a dioptric imaging optical sub-system arranged in an optical path between the catadioptric imaging optical sub-system and the substrate, the dioptric imaging optical sub-system comprising a dioptric axis along a straight line and a plurality of lenses; and*

*an aperture stop arranged in the optical path between the mask and the substrate to control a coherence factor of the catadioptric imaging optical system.*

*33. A catadioptric imaging optical system according to claim 32, wherein said catadioptric imaging optical sub-system comprises an optical group including*

*a concave mirror, and*

*a group optical axis,*

*wherein the group optical axis intersects the dioptric optical axis.*

*34. A catadioptric imaging optical system according to claim 33, further comprising an optical path deflecting member arranged between said catadioptric imaging optical sub-system and said dioptric imaging optical sub-system.*

*35. A catadioptric imaging optical system according to claim 34, wherein said optical path deflecting member comprises a reflection surface inclined with respect to the dioptric optical axis.*

*36. A catadioptric imaging optical system according to claim 32, wherein said catadioptric imaging optical sub-system is closer to the mask than said dioptric imaging optical sub-system and is on the optical path between the mask and the substrate.*

*37. A catadioptric imaging optical system according to claim 32, wherein said catadioptric imaging optical sub-system comprises a catadioptric optical axis along a straight line, and the catadioptric optical axis and the dioptric optical axis intersect.*

*38. A catadioptric imaging optical system according to claim 37, wherein said catadioptric imaging optical sub-system is closer to the mask than said dioptric imaging optical sub-system and is on the optical path between the mask and the substrate.*

*39. A catadioptric imaging optical system used in a projection optical system that transfers a pattern on a mask onto a substrate, comprising:*

*from the mask to an intermediate image, a catadioptric imaging optical sub-system arranged in an optical path between the mask and the substrate; and*

*from the intermediate image to a second image, a dioptric imaging optical sub-system arranged between the catadioptric imaging optical sub-system and the substrate, the dioptric imaging optical sub-system comprising a dioptric optical axis along a straight line,*

*wherein the dioptric imaging optical sub-system further comprises an aperture stop, wherein the aperture stop controls a coherence factor of the dioptric imaging optical sub-system.*

*40. A catadioptric imaging optical system according to claim 32, wherein the catadioptric imaging optical system forms an image in an area of the substrate that is off the dioptric optical axis.*

*41. A projection exposure apparatus that transfers a pattern off a mask onto a substrate, comprising:*

*a catadioptric imaging optical system according to claim 32,*

*wherein said catadioptric imaging optical system forms an exposure area at a position off of the dioptric optical axis of the dioptric imaging object sub-system.*

*42. A projection exposure apparatus according to claim 41, wherein the mask and the substrate are scanned at different speeds corresponding to a magnification of said catadioptric imaging optical system.*

*43. A method of imaging a pattern on a mask onto a substrate using a catadioptric imaging optical system, the method comprising:*

*guiding a light from the mask to a catadioptric imaging optical sub-system to form an intermediate image;*

*guiding the light from the intermediate image after the catadioptric imaging optical sub-system to a dioptric imaging optical sub-system that comprises a dioptric optical axis along a straight line and a plurality of lenses;*

*forming a final image of the mask on the substrate using the light from the dioptric imaging optical sub-system, the dioptric imaging optical sub-system being from the intermediate image to the final image; and*

*controlling a coherence factor of the catadioptric imaging optical system.*

*44. A method according to claim 43, wherein the catadioptric imaging optical sub-system is closer to the mask than the dioptric imaging optical sub-system and is on an optical path between the mask and the substrate.*

*45. A method according to claim 43, wherein the catadioptric imaging optical sub-system comprises a catadioptric optical axis along a straight line, and the dioptric optical axis and the catadioptric optical axis intersect.*

*46. A method according to claim 45, wherein the catadioptric imaging optical sub-system is closer to the mask than the dioptric imaging optical sub-system and is on an optical path between the mask and the substrate.*

*47. A method according to claim 45, wherein said guiding the light from the catadioptric imaging optical sub-system to the dioptric imaging optical sub-system further comprises reflecting the light using a concave mirror of the catadioptric imaging optical sub-system, wherein an optical group including the concave mirror has a group optical axis that intersects the dioptric optical axis.*

*48. A method according to claim 43, wherein said forming the final image comprises forming the first image in an area on the substrate off the dioptric optical axis.*

*49. A projection optical system for forming an image of a first object onto a second object, comprising:*

*a catadioptric sub-system, arranged in an optical path between the first and the second object, having an optical path changing mirror, lenses, and a concave mirror; and*

*a dioptric imaging sub-system arranged in an optical path between the catadioptric sub-system and the second object,*

*wherein:*

*an intermediate image of the first object is formed in the optical path between the catadioptric sub-system and the dioptric imaging sub-system,*

*the lenses in the catadioptric sub-system include at least one lens arranged in an optical path between the optical path changing mirror and the concave mirror,*

*for each of the lenses in the catadioptric sub-system including the at least one lens disposed between the optical path changing mirror and the concave mirror, a distance from each lens to the optical path changing mirror is greater than a corresponding distance from each lens to the concave mirror, and*

*the dioptric imaging sub-system forms a second image and is from the intermediate image to the second image.*

*50. A projection optical system for forming an image of a first object onto a second object, comprising:*

*a catadioptric sub-system, arranged in an optical path between the first and the second object, having an optical path changing mirror, lenses, and a concave mirror; and*

*a dioptric imaging sub-system arranged in an optical path between the catadioptric sub-system and the second object,*

*wherein:*

*an intermediate image of the first object is formed in the optical path between the catadioptric sub-system and the dioptric imaging sub-system,*

*the catadioptric sub-system has at least one positive lens disposed in an optical path between the first object and the optical path changing mirror,*

*not more than one positive and not more than three negative lenses are arranged between the optical path changing mirror and the concave mirror,*

*the dioptric imaging sub-system forms a second image and is from the intermediate image to the second image, and*

*the projection optical system is both side telecentric.*

*51. A projection optical system for forming an image of a first object onto a second object, comprising:*

*a catadioptric sub-system, arranged in an optical path between the first and the second object, having an optical path changing mirror, lenses, and a concave mirror; and*

*a dioptric imaging sub-system arranged in an optical path between the catadioptric sub-system and the second object,*

*wherein:*

*an intermediate image of the first object is formed in the optical path between the catadioptric sub-system and the dioptric imaging sub-system,*

*the dioptric imaging sub-system, in the order from the intermediate side, has a positive lens group, a negative lens group, a positive lens group, a negative lens group, and a positive lens group,*

*the dioptric imaging sub-system forms a second image and is from the intermediate image to the second image, and*

*the projection optical system is both side telecentric.*

52. A projection optical system for forming an image of a first object onto a second object, comprising:

a catadioptric sub-system, arranged in an optical path between the first and the second object, having an optical path changing mirror, lenses, and a concave mirror; and a dioptric imaging sub-system arranged in an optical path between the catadioptric sub-system and the second object, wherein:

an intermediate image of the first object is formed in the optical path between the catadioptric sub-system and the dioptric imaging sub-system, the dioptric imaging sub-system has at least one negative-positive doublet with a negative power lens and a positive power lens in the sequence from the first object side, the dioptric imaging sub-system forms a second image and is from the intermediate image to the second image, and the projection optical system is both side telecentric.

53. A projection optical system for forming an image of a first object onto a second object, comprising:

a catadioptric sub-system, arranged in an optical path between the first and the second object, having an optical path changing mirror, lenses, and a concave mirror; and a dioptric imaging sub-system arranged in an optical path between the catadioptric sub-system and the second object, wherein:

an intermediate image of the first object is formed in the optical path between the catadioptric sub-system and the dioptric imaging sub-system, the dioptric imaging sub-system has a first group of lenses, a second group of lenses, and a third group of lenses, the dioptric imaging sub-system forms a second image and is from the intermediate image to the second image, and the projection optical system is both side telecentric.

54. A projection optical system for forming an image of a first object onto a second object, comprising:

a catadioptric sub-system, arranged in an optical path between the first and the second object, having an optical path changing mirror, lenses, and a concave mirror; and a dioptric sub-system arranged in an optical path between said catadioptric sub-system and the second object, wherein:

an intermediate image of the first object is formed in the optical path, lenses in said catadioptric sub-system including at least one lens arranged between the optical path changing mirror and the concave mirror, a distance from each lens of the lenses in said catadioptric sub-system including said at least one lens to the optical path changing mirror is greater than a corresponding distance from each lens to the concave mirror, and said dioptric sub-system comprises a pair of meniscus lenses including an intermediate-side meniscus lens and an image-side meniscus lens, wherein a convex surface of the intermediate-side meniscus lens faces the intermediate image, and a convex surface of the image-side meniscus lens faces the image.

55. A projection optical system for forming an image of a first object onto a second object, comprising:

a catadioptric sub-system, arranged in an optical path between the first and the second object, having an optical path changing mirror, lenses, and a concave mirror; and a dioptric imaging sub-system arranged in an optical path between the catadioptric sub-system and the second object, wherein:

an intermediate image of the first object is formed in the optical path between the catadioptric sub-system and the dioptric imaging sub-system, the catadioptric sub-system has at least one positive lens disposed between the first object and the optical path changing mirror, not more than one positive lens and not more than three negative lenses are arranged between the optical path changing mirror and the concave mirror, the system is both sides telecentric, the dioptric imaging sub-system forms a second image and is from the intermediate image to the second image, and the dioptric imaging sub-system comprises a pair of meniscus lenses including an intermediate-side meniscus lens and an image-side meniscus lens, wherein a convex surface of the intermediate-side meniscus lens faces the intermediate image, and a convex surface of the image-side meniscus lens faces the second image.

56. A projection optical system for forming an image of a first object onto a second object, comprising:

a catadioptric sub-system, arranged in an optical path between the first and the second object, having an optical path changing mirror, lenses, and a concave mirror; and a dioptric imaging sub-system arranged in an optical path between the catadioptric sub-system and the second object, wherein:

an intermediate image of the first object is formed in the optical path between the catadioptric sub-system and the dioptric imaging sub-system, the dioptric imaging sub-system, in the order from the intermediate side, has a positive lens group, a negative lens group, a positive lens group, a negative lens group, and a positive lens group, the dioptric imaging sub-system forms a second image and is from the intermediate image to the second image, and the dioptric imaging sub-system comprises a pair of meniscus lenses including an intermediate-side meniscus lens and an image-side meniscus lens, wherein a convex surface of the intermediate-side meniscus lens faces the intermediate image, and a convex surface of the image-side meniscus lens faces the second image.

57. A projection optical system for forming an image of a first object onto a second object, comprising:

a catadioptric sub-system, arranged in an optical path between the first and the second object, having an optical path changing mirror, lenses, and a concave mirror; and

*a dioptric imaging sub-system arranged in an optical path between the catadioptric sub-system and the second object,*

*wherein:*

*an intermediate image of the first object is formed in the optical path between the catadioptric sub-system and the dioptric imaging sub-system,*

*the dioptric imaging sub-system has at least one negative-positive doublet with a negative power lens and a positive power lens in the sequence from the first object side,*

*the dioptric imaging sub-system forms a second image and is from the intermediate image to the second image, and*

*the dioptric sub-system comprises a pair of meniscus lenses including an intermediate-side meniscus lens and an image-side meniscus lens, wherein*

*a convex surface of the intermediate-side meniscus lens faces the intermediate image, and*

*a convex surface of the image-side meniscus lens faces the second image.*

*58. A projection optical system for forming an image of a first object onto a second object, comprising:*

*a catadioptric sub-system, arranged in an optical path between the first and the second object, having an optical path changing mirror, lenses, and a concave mirror; and*

*a dioptric imaging sub-system arranged in an optical path between the catadioptric sub-system and the second object,*

*wherein:*

*an intermediate image of the first object is formed in the optical path between the catadioptric sub-system and the dioptric imaging sub-system,*

*the dioptric imaging sub-system has a first group of lenses, a second group of lenses, and a third group of lenses,*

*the dioptric imaging sub-system forms a second image and is from the intermediate image to the second image, and*

*the dioptric imaging sub-system comprises a pair of meniscus lenses including an intermediate-side meniscus lens and an image-side meniscus lens, wherein*

*a convex surface of the intermediate-side meniscus lens faces the intermediate image, and*

*a convex surface of the image-side meniscus lens faces the image.*

*59. A projection optical system according to claim 54, wherein said dioptric sub-system comprises first, second, and third groups of lenses, and wherein the pair of meniscus lenses are in the second group of lenses.*

*60. A projection optical system according to claim 55, wherein said dioptric sub-system comprises first, second, and third groups of lenses, and wherein the pair of meniscus lenses are in the second group of lenses.*

*61. A projection optical system according to claim 56, wherein the pair of meniscus lenses are in the second positive and negative lens groups.*

*62. A projection optical system according to claim 57, wherein said dioptric sub-system comprises first, second, and third groups of lenses, and wherein the pair of meniscus lenses are in the second group of lenses.*

*63. A projection optical system according to claim 58, wherein the pair of meniscus lenses is arranged in the second group of lenses.*

*64. A projection optical system according to claim 52, wherein said dioptric optical sub-system has a first group of lenses, a second group of lenses, and a third group of lenses, and wherein the negative-positive doublet lens is arranged in the third group of lenses.*

*65. A projection optical system according to claim 53, wherein said dioptric sub-system has at least one negative-positive doublet lens with a negative power lens and a positive power lens in the sequence from the first object side, and wherein the negative-positive doublet lens is arranged in the third group of lenses.*

*66. A projection optical system for forming an image of a first object onto a second object, comprising:*

*a catadioptric sub-system, arranged in an optical path between the first and the second object, having an optical path changing mirror, lenses, and a concave mirror; and*

*a dioptric imaging sub-system arranged in an optical path between the catadioptric sub-system and the second object,*

*wherein:*

*an intermediate image of the first object is formed in the optical path,*

*the lenses in the catadioptric sub-system include at least one lens arranged between the optical path changing mirror and the concave mirror,*

*for each of the lenses in the catadioptric sub-system including the at least one lens disposed between the optical path changing mirror and the concave mirror, a distance from each lens to the optical path changing mirror is greater than a corresponding distance from each lens to the concave mirror, and*

*the catadioptric sub-system has no more than five lenses.*

*67. A projection optical system according to claim 50, wherein said catadioptric sub-*system has no more than five lenses.

*68. A projection optical system according to claim 51, wherein said catadioptric sub-system has no more than five lenses.*

*69. A projection optical system according to claim 52, wherein said catadioptric sub-system has no more than five lenses.*

*70. A projection optical system according to claim 53, wherein said catadioptric sub-system has no more than five lenses.*

*71. A projection optical system according to claim 64, wherein said catadioptric sub-system has no more than five lenses.*

*72. A projection optical system according to claim 65, wherein said catadioptric sub-system has no more than five lenses.*

*73. A projection optical system for forming an image of a first object onto a second object, comprising:*

*from the first object to an intermediate image, a catadioptric sub-system, arranged in an optical path between the first and the second object, having an optical path changing mirror, lenses, and a concave mirror; and*

*from the intermediate image to the second object, a dioptric imaging sub-system arranged in an optical path between said catadioptric sub-system and the second object,*

*wherein:*

*the intermediate image of the first object is formed in the optical path,*

*lenses in said catadioptric sub-system including at least one lens arranged between the optical path changing mirror and the concave mirror,*

*a distance from each lens of the lenses of said catadioptric sub-system including said at least one lens to the optical path changing mirror is greater than a corresponding distance from each lens to the concave mirror, and*

*the projection optical system is both side telecentric.*

*74. A projection optical system according to claim 52, wherein the negative-positive doublet lens is behind a last beam waist.*

*75. A projection exposure apparatus comprising:*

*a laser light source;*

*an illumination system;*

*a mask holding system;*

*a projection optical system according to claim 49; and*

*a wafer holding system.*

*76. A projection exposure apparatus comprising:*

*a laser light source;*

*an illumination system;*

*a mask holding system;*

*a projection optical system according to claim 50; and*

*a wafer holding system.*

*77. A projection exposure apparatus comprising:*

*a laser light source;*

*an illumination system;*

*a mask holding system;*

*a projection optical system according to claim 51; and*

*a wafer holding system.*

*78. A projection exposure apparatus comprising:*

*a laser light source;*

*an illumination system;*

*a mask holding system;*

*a projection optical system according to claim 52; and*

*a wafer holding system.*

*79. A projection exposure apparatus comprising:*

*a laser light source;*

*an illumination system;*

*a mask holding system;*

*a projection optical system according to claim 53; and*

*a wafer holding system.*

*80. A method of producing a device by projection exposure making use of a projection exposure apparatus according to claim 75.*

*81. A method of producing a device by projection exposure making use of a projection exposure apparatus according to claim 76.*

*82. A method of producing a device by projection exposure making use of a projection exposure apparatus according to claim 77.*

*83. A method of producing a device by projection exposure making use of a projection exposure apparatus according to claim 78.*

*84. A method of producing a device by projection exposure making use of a projection exposure apparatus according to claim 79.*

*85. A method according to claim 80, wherein the projection exposure apparatus is a step-and-repeat type, or a step-and-scanning type.*

*86. A method according to claim 81, wherein the projection exposure apparatus is a step-and-repeat type, or a step-and-scanning type.*

*87. A method according to claim 82, wherein the projection exposure apparatus is a step-and-repeat type, or a step-and-scanning type.*

*88. A method according to claim 83, wherein the projection exposure apparatus is a step-and-repeat type, or a step-and-scanning type.*

*89. A method according to claim 84, wherein the projection exposure apparatus is a step-and-repeat type, or a step-and-scanning type.*

*90. The catadioptric imaging optical system of claim 32, wherein said catadioptric imaging optical sub-system further comprises*

*a first group with positive refractive power,*

*a second group including a concave mirror, and*

*a mirror between the first and second group.*

*91. The method of claim 43, wherein the catadioptric imaging optical sub-system further comprises*

*a first group with positive refractive power,*

*a second group including a concave mirror, and*

*a mirror between the first and second groups.*

*92. The projection optical system of claim 49, wherein the lenses of said catadioptric sub-system comprises a first group with positive refractive power and a second group with the concave mirror, and an optical path changing mirror between the first group and the second group.*

*93. The projection optical system of claim 50, wherein the lenses of said catadioptric sub-system comprises a first group with positive refractive power and a second group with the concave mirror.*

*94. The projection optical system of claim 51, wherein the lenses of said catadioptric sub-system comprises a first group with positive refractive power and a second group with the concave mirror.*

*95. The projection optical system of claim 52, wherein the lenses of said catadioptric sub-system comprises a first group with positive refractive power and a second group with the concave mirror.*

*96. The projection optical system of claim 53, wherein the lenses of said catadioptric sub-system comprises a first group with positive refractive power and a second group with the concave mirror.*

* * * * *